(12) United States Patent
Molnar et al.

(10) Patent No.: US 8,620,254 B2
(45) Date of Patent: Dec. 31, 2013

(54) WIRELESS COMMUNICATION DEVICE AND SYSTEM

(75) Inventors: Alyosha Molnar, Ithaca, NY (US); Caroline Andrews, San Francisco, CA (US)

(73) Assignee: Cornell University, Ithaca, NY (US)

(*) Notice: Subject to any disclaimer, the term of this patent is extended or adjusted under 35 U.S.C. 154(b) by 0 days.

(21) Appl. No.: 13/576,528

(22) PCT Filed: Feb. 3, 2011

(86) PCT No.: PCT/US2011/023586
§ 371 (c)(1),
(2), (4) Date: Nov. 16, 2012

(87) PCT Pub. No.: WO2011/097366
PCT Pub. Date: Aug. 11, 2011

(65) Prior Publication Data
US 2013/0059556 A1 Mar. 7, 2013

Related U.S. Application Data

(60) Provisional application No. 61/301,330, filed on Feb. 4, 2010.

(51) Int. Cl.
*H04B 1/26* (2006.01)
*H04K 3/00* (2006.01)

(52) U.S. Cl.
USPC .......................................... 455/324; 455/326

(58) Field of Classification Search
USPC .......................................... 455/313, 323–326
See application file for complete search history.

(56) References Cited

U.S. PATENT DOCUMENTS 6,999,745 B2   2/2006   Leenaerts
(Continued)

FOREIGN PATENT DOCUMENTS

| EP | 2270982 A2 | 1/2011 |
|---|---|---|
| KR | 1020080025480 A | 3/2008 |
| WO | 2009120117 A1 | 10/2009 |

OTHER PUBLICATIONS

Andrews et al.; A Passive-Mixer-First Receiver with Baseband-Controlled RF Impedance Matching; 2010 IEEE International Solid-State Circuits Conference Digest of Technical Papers [Online] 2010, 99. 46-47.

(Continued)

*Primary Examiner* — Lee Nguyen
(74) *Attorney, Agent, or Firm* — William Greener; Bond, Schoeneck & King, PLLC

(57) ABSTRACT

The present invention is directed to a wireless communications device that includes an antenna configured to receive an RF signal from an ambient environment. The antenna is characterized by an antenna impedance and the RF signal is characterized by a predetermined frequency. A passive mixer assembly is coupled to the antenna without an RF matching network. The passive mixer assembly is characterized by a passive mixer impedance presented to the antenna. The passive mixer assembly includes a plurality of baseband mixer ports. The passive mixer assembly is configured to downconvert the RF signal and provide a plurality of baseband signals. Each baseband signal of the plurality of baseband signals is directed out of a corresponding port of the plurality of baseband mixer ports and characterized by a predetermined phase of a plurality of predetermined phases. A baseband low noise amplifier (baseband-LNA) assembly is coupled to the passive mixer assembly. The baseband-LNA assembly includes a baseband-LNA input portion configured to receive the plurality of baseband signals from the passive mixer assembly. The baseband-LNA assembly is configured to provide a plurality of amplified baseband signals from a baseband-LNA output portion. A baseband feedback network is coupled between the baseband-LNA output portion and the baseband-LNA input portion. The baseband feedback network includes a plurality of first adjustable resistive components. The plurality of first adjustable resistive components is selectively adjustable such that the passive mixer impedance is substantially matched to the antenna impedance at the predetermined RF frequency.

20 Claims, 17 Drawing Sheets

(56) References Cited

U.S. PATENT DOCUMENTS

| | | |
|---|---|---|
| 6,999,747 B2 | 2/2006 | Su |
| 7,353,010 B1 | 4/2008 | Zhang et al. |
| 7,460,844 B2 | 12/2008 | Molnar et al. |
| 7,529,529 B2 | 5/2009 | Taylor |
| 7,599,675 B2 | 10/2009 | Mu et al. |
| 7,865,164 B2 | 1/2011 | Xu et al. |
| 2005/0030094 A1 | 2/2005 | Conrad et al. |
| 2007/0064843 A1 | 3/2007 | Vavelidis et al. |
| 2007/0139122 A1 | 6/2007 | Nagarkatti et al. |
| 2007/0218855 A1 | 9/2007 | Ismail et al. |
| 2008/0242252 A1 | 10/2008 | Youssoufian |
| 2008/0284487 A1* | 11/2008 | Pullela et al. ............ 327/355 |
| 2009/0042527 A1 | 2/2009 | Niknejad |
| 2009/0156152 A1 | 6/2009 | Sahota et al. |
| 2009/0202022 A1 | 8/2009 | Kaczman et al. |
| 2009/0238313 A1 | 9/2009 | Wang et al. |
| 2010/0029323 A1 | 2/2010 | Tasic et al. |
| 2010/0267354 A1 | 10/2010 | Mirzaei et al. |
| 2011/0124307 A1* | 5/2011 | Balankutty et al. ........... 455/296 |

OTHER PUBLICATIONS

Andrews et al.; A Passive-Mixer-First Receiver with Digitally-Controlled and Widely Tunable RF Interface; IEEE Journal of Solid-State Circuits [Online] 2010, vol. 45, Issue 12, pp. 2696-2708.

Andrews et al.; Implications of Passive-Mixer-Transparency for Impedance Matching and Noise Figure in Passive-Mixer-First Receivers; IEEE Transactions on Circuits and Systems I: Regular Papers [Online] 2010, vol. 57, Issue 12, pp. 3092-3103.

* cited by examiner

RERADIATION SPECTRUM

WIRELESS COMMUNICATION DEVICE AND SYSTEM

CROSS-REFERENCE TO RELATED APPLICATIONS

This application claims the benefit of priority under 35 U.S.C. §119(e) to U.S. Provisional Patent Application Ser. No. 61/301,330, filed on Feb. 4, 2010, the content of which is relied upon and incorporated herein by reference in its entirety.

GOVERNMENT FUNDING

This invention was made with Government support under Grant Number 0925670 awarded by the National Science Foundation. The United States Government has certain rights in the invention.

BACKGROUND OF THE INVENTION

1. Field of the Invention

The present invention relates generally to software defined radio systems, and particularly to RF interfaces.

2. Technical Background

A software-defined radio (SDR) ideally allows all of the radio parameters to be programmed dynamically by its computer software. A radio system typically includes components such as mixers, filters, amplifiers, modulators/demodulators, detectors, etc. In the standard radio, these components are implemented exclusively in hardware and their operational settings are predetermined and permanent. In an SDR, the operational settings may be adjusted by the software such that the SDR may be used for a variety of different purposes and over more than one type of wireless network. Accordingly, SDRs may be used in a variety of applications including military, emergency services (e.g., police, fire, ambulance, etc.), commercial and civilian. For example, the various branches of the armed services (such as the Army and Navy) may operate at different frequencies using different types of communication formats. The SDR provides a given user with the ability to dynamically change the SDR such that inter-service communications are effected. In another example, the networks operated by various cell phone providers may use different frequencies or formats; an SDR will dynamically reconfigure itself as the user moves from one network into another.

As shown in FIGS. 1(a)-1(d), SDRs may be implemented using a variety of different form factors. FIG. 1(a) shows an SDR 1000 implemented as a typical cell phone having a speakers 400, microphone 401, display 700, and a keypad input 800. FIG. 1(b) shows another SDR example that may include, e.g., a camera 850, in addition to microphone/speaker 400, keypad 800 and display 700. FIG. 1(c) depicts another SDR form factor. This embodiment is generically referred to as a personal digital assistant and may provide the user with cell phone service, wireless internet access, a camera, digital video, or other such services. FIG. 1(d) is an example of a commercial device that includes a camera 850, a bar code reader (not shown), keypad and data entry components (800, 802), as well as display 700. Those skilled in the art will understand that the present invention should not be construed as being limited to the examples provided herein.

In recent years, innovations in both circuit architectures and process technologies have enabled great programmability with respect to bandwidth, oscillation frequency, gain, and modulation type. However, the interface between the antenna and the receiver which could include an RF LNA, matching network and/or an RF-band filter (often a SAW filter), remains very difficult to tune.

Ideally, the antenna interface of an RF receiver should perform three functions: (1) match the impedance of the antenna so as to extract the maximum possible wanted (in-band) signal power from the antenna and prevent reflections, (2) amplify the wanted signal with low noise, and (3) reject unwanted (out-of-band) interferers. However, the structures currently used to achieve both good impedance matching and low susceptibility to blockers requires resonant structures that are inherently highly frequency dependent. Thus, one drawback to the current state of the art relates to the difficulty in achieving the aforementioned goals over wide RF tuning range.

One of the approaches considered for realizing a wide band receiver (i.e., capable of capturing several widely spaced bands) employs multiple narrowband front-ends that are disposed in parallel. Only one of the parallel receivers may be used at a time. Another approach that has been considered is the use of a wideband receiver that has only moderate rejection of interference (out-of-band IIP3 of <0 dBm) in the various frequency bands. The former approach comes at significant cost in area both on chip and off, and the latter simply cannot achieve the necessary performance for many applications (cellular, etc.). Accordingly, the current state of the art does not provide a high performance, high tuning range SDR.

The architecture of high performance (and therefore) narrowband direct conversion receivers typically includes (in order of the input signal path) an off-chip RF-band filter, a matching network, low noise amplifier (LNA), mixer, and baseband circuitry. The components which are difficult to tune across frequency are the ones which "see" the RF signal; i.e., the components in the signal path that are disposed upstream of the mixer. As those of ordinary skill in the art will appreciate, an RF-band filter rejects out-of-band blockers, and is typically implemented with high-Q off-chip components such as SAW filters. The matching network, typically implemented with a resonant LC network, transfers as much power as possible to the LNA. The LNA absorbs the RF power and provides amplification of the signal with as little noise as possible. Indeed, a good definition of an LNA is an amplifier that provides an impedance match with less than a 3 dB noise figure (something a simple resistive matching network cannot achieve). When the second approach is employed (i.e., a widely tunable receiver), the RF-band filter is removed entirely; a lower performance wideband LNA is substituted in its place. The LNA is matched such that higher power is transferred vis à vis the first approach considered.

In principle, a direct conversion receiver does not require any RF components other than a mixer and local oscillator in order to function. Indeed, early homodyne receivers included only these components; the antenna was directly connected to the mixer without employing an RF LNA. However in order to provide antenna impedance matching, this approach requires additional components between the antenna and the mixer. As noted above, LC impedance matching circuits are frequency dependent and, therefore, narrow band in nature. Additionally, this approach does not provide any rejection of out-of-band interferers.

What is needed therefore is a wide-band programmable software-defined radio (SDR) receiver that addresses the drawbacks associated with the approaches described above. In particular, what is needed is an SDR that addresses the issues related to impedance matching, noise figure and rejection of out of band interferers.

SUMMARY OF THE INVENTION

The present invention addresses the needs described above by providing a software defined radio (SDR) receiver with baseband programmable RF bandpass filter (BPF) and complex impedance match is presented. The receiver of the present invention employs a passive mixer-first approach, eliminating the traditional RF filter, RF matching network, and LNA. Moreover, the present invention implements these three components at the baseband, and translates their effects to the antenna using the transparency property of passive mixers. As a result, the present invention provides significant benefits, such as extremely low power or greatly increased tuning range and linearity.

One aspect of the present invention is directed to a wireless communications device that includes an antenna configured to receive an RF signal from an ambient environment. The antenna is characterized by an antenna impedance and the RF signal is characterized by a predetermined frequency. A passive mixer assembly is coupled to the antenna without an RF matching network. The passive mixer assembly is characterized by a passive mixer impedance presented to the antenna. The passive mixer assembly includes a plurality of baseband mixer ports. The passive mixer assembly is configured to downconvert the RF signal and provide a plurality of baseband signals. Each baseband signal of the plurality of baseband signals is directed out of a corresponding port of the plurality of baseband mixer ports and characterized by a predetermined phase of a plurality of predetermined phases. A baseband low noise amplifier (baseband-LNA) assembly is coupled to the passive mixer assembly. The baseband-LNA assembly includes a baseband-LNA input portion configured to receive the plurality of baseband signals from the passive mixer assembly. The baseband-LNA assembly is configured to provide a plurality of amplified baseband signals from a baseband-LNA output portion. A baseband feedback network is coupled between the baseband-LNA output portion and the baseband-LNA input portion. The baseband feedback network includes a plurality of first adjustable resistive components. The plurality of first adjustable resistive components is selectively adjustable such that the passive mixer impedance is substantially matched to the antenna impedance at the predetermined RF frequency.

In another aspect, the present invention is directed to a wireless communications device that includes an antenna configured to receive an RF signal from an ambient environment. The antenna is characterized by an antenna impedance and the RF signal is characterized by a predetermined frequency. A passive mixer assembly is coupled to the antenna without an RF matching network. The passive mixer assembly is characterized by a passive mixer impedance presented to the antenna. The passive mixer assembly includes a plurality of baseband mixer ports. The passive mixer assembly is configured to downconvert the RF signal and provide a plurality of baseband signals. Each baseband signal of the plurality of baseband signals is directed out of a corresponding port of the plurality of baseband mixer ports and characterized by a predetermined phase of a plurality of predetermined phases. A baseband low noise amplifier (baseband-LNA) assembly is coupled to the passive mixer assembly. The baseband-LNA assembly includes a baseband-LNA input portion configured to receive the plurality of baseband signals from the passive mixer assembly. The baseband-LNA assembly is configured to provide a plurality of amplified baseband signals from a baseband-LNA output portion. A baseband feedback network is coupled between the baseband-LNA output portion and the baseband-LNA input portion. The baseband feedback network includes a plurality of first adjustable resistive components and a plurality of second adjustable resistive components that are switchable between a first feedback connective state and a second feedback connective state. The plurality of first adjustable resistive components and the plurality of second adjustable resistive components are individually adjustable such that the passive mixer impedance substantially corresponds to the complex conjugate of the antenna impedance at the predetermined RF frequency.

In yet another aspect, the present invention is directed to a software defined radio (SDR) device that includes a user interface disposed on or in a SDR housing. The user interface includes at least one data input portion and at least one data output portion, the at least one data input portion being configured to generate a plurality of computer readable commands. A computing circuit assembly is coupled to the user interface. The computing circuit assembly is configured to process the plurality of computer readable commands and drive the at least one data output portion. The computing circuit assembly is programmed to: select an SDR mode of operation in response to the plurality of computer readable commands or an SDR operational environment; determine a plurality of RF parameters based on the SDR mode of operation (the plurality of RF parameters including a predetermined frequency); determine a plurality of variable baseband parameters corresponding to the plurality of system RF parameters; and provide the plurality of variable baseband parameters to a memory portion. The SDR also includes a wireless communications assembly. The assembly includes an antenna configured to receive an RF signal from an ambient environment. The antenna is characterized by an antenna impedance and the RF signal is characterized by a predetermined frequency. A passive mixer assembly is coupled to the antenna without an RF matching network. The passive mixer assembly is characterized by a passive mixer impedance presented to the antenna. The passive mixer assembly includes a plurality of baseband mixer ports. The passive mixer assembly is configured to downconvert the RF signal and provide a plurality of baseband signals. Each baseband signal of the plurality of baseband signals is directed out of a corresponding port of the plurality of baseband mixer ports and characterized by a predetermined phase of a plurality of predetermined phases. A baseband low noise amplifier (baseband-LNA) assembly is coupled to the passive mixer assembly. The baseband-LNA assembly includes a baseband-LNA input portion configured to receive the plurality of baseband signals from the passive mixer assembly. The baseband-LNA assembly is configured to provide a plurality of amplified baseband signals from a baseband-LNA output portion. A baseband feedback network is coupled between the baseband-LNA output portion and the baseband-LNA input portion. The baseband feedback network includes a plurality of first adjustable resistive components and a plurality of second adjustable resistive components that are switchable between a first feedback connective state and a second feedback connective state. The plurality of first adjustable resistive components and the plurality of second adjustable resistive components are individually adjustable such that the passive mixer impedance substantially corresponds to the complex conjugate of the antenna impedance at the predetermined RF frequency.

The term "wireless" as used herein refers to a device, system and/or method used for radio communications. Thus, an SDR/wireless device or system of the present invention may accommodate voice, internet, video, audio, and/or any other type of data transmitted/received via a radio/wireless channel.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Figure 7:
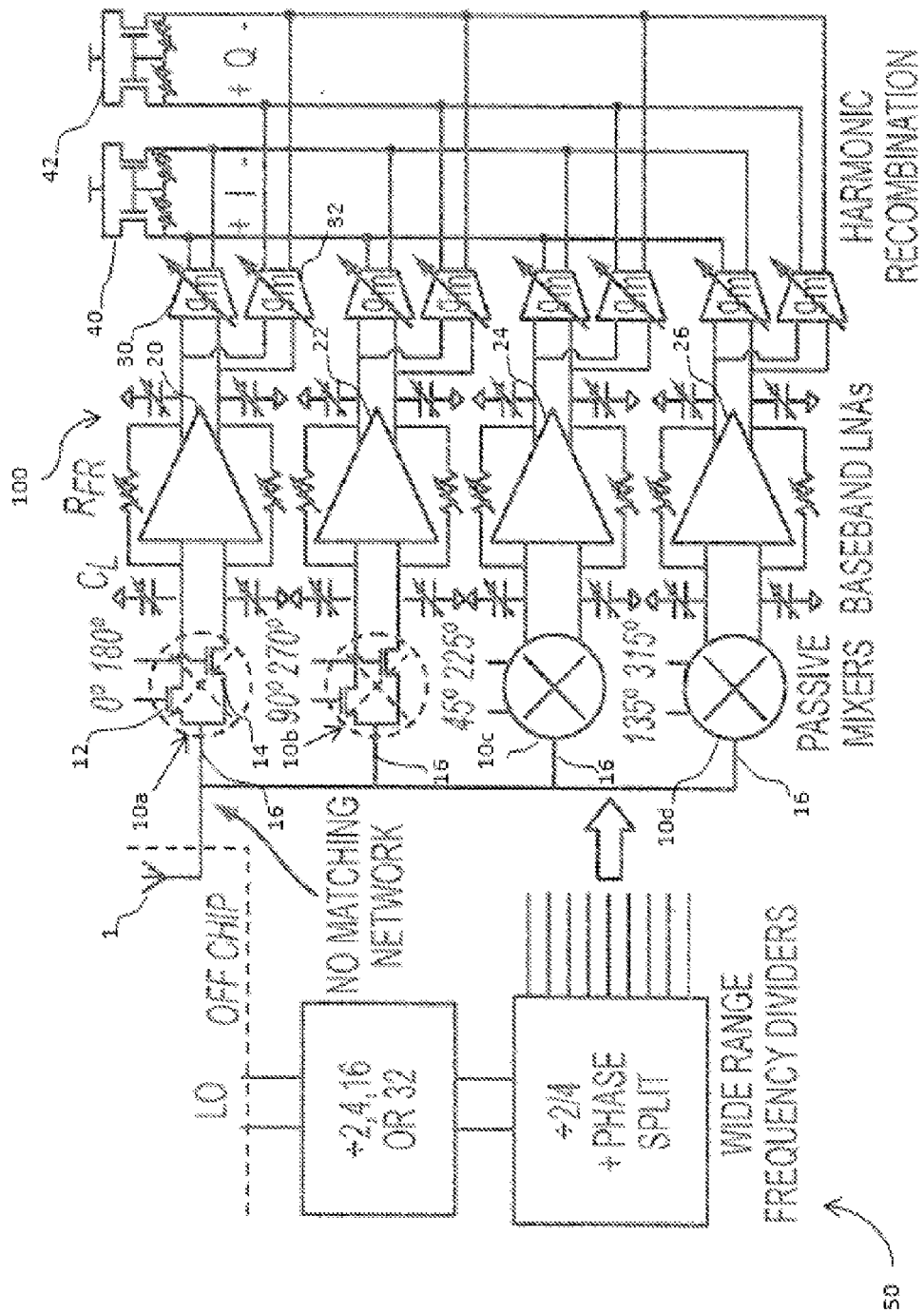
FIG. 7 is schematic diagram of a single-chip receiver architecture including tunable baseband impedance matching and programmable multi-phase mixing in accordance with the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the receiver of the present invention is shown in FIG. 7, and is designated generally throughout by reference numeral 100.

Figure 2:
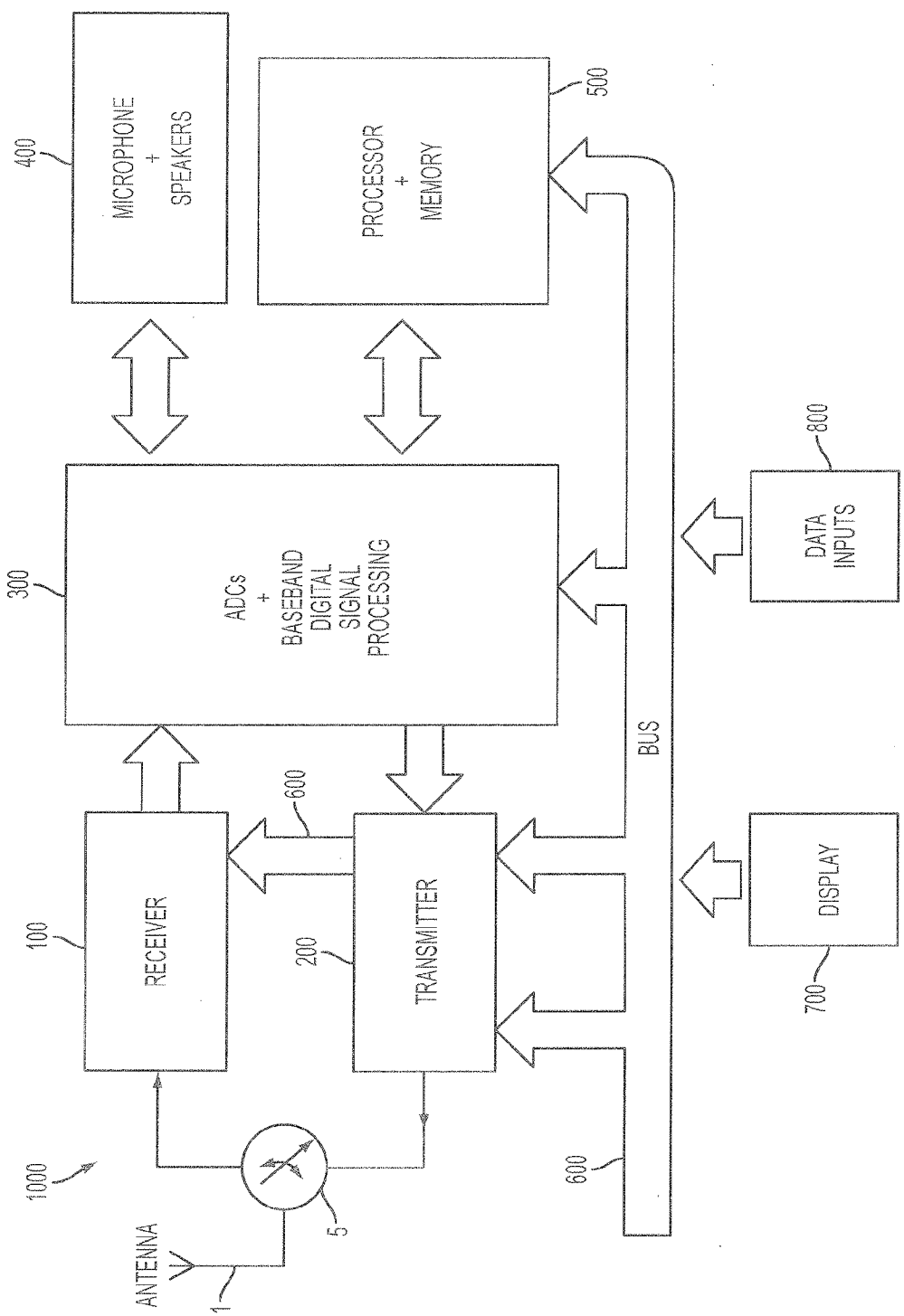
FIG. 2 is a block diagram of an SDR in accordance with the present invention.

As embodied herein and depicted in FIG. 2, a block diagram of an SDR 1000 in accordance with the present invention is disclosed. SDR 1000 includes an RF receiver 100 which receives RF signals via antenna 1 and diplexer 5. As will be described in detail below, the receiver 100 converts the RF signal into an analog baseband signal. The analog baseband signal is directed into an analog-to-digital converted (ADC) where it is converted into a digital baseband signal for further processing. The digital baseband signal is converted into audio and directed to the speaker.

On the transmit side, a user's speech is ultimately converted into a baseband electrical format and modulated into an RF signal by transmitter 200. The diplexer 5 directs the RF transmit signal to antenna 1 which directs the RF signal into the environment. Obviously, the signaling data that is used to route the call is provided by the user via the data input device (e.g., key pad) 800. The signaling data is, of course, displayed on display 700 for the user's benefit, and appended to the voice data by the baseband digital signaling processor 300. The baseband receiver 300 must also determine if an incoming RF signal is directed to the user by decoding the telephone number.

Note that the processor unit 500 is coupled to the receiver 100, transmitter 200, and baseband digital processor 300. Of course, the processor 500 is programmed to dynamically change the parameters of the various components of SDR 1000 such that the SDR 1000 may be used in a variety of different of networks and/or applications.

The present invention is directed to providing a wide-band programmable software-defined radio (SDR) receiver 100 that addresses the drawbacks associated with the approaches described in the technical background section of this document. In particular, the present invention provides a software defined radio (SDR) receiver 100 with baseband programmable RF bandpass filter (BPF) and complex impedance match is presented. As described below, the receiver 100 of the present invention employs a passive mixer-first approach, eliminating the traditional RF filter, RF matching network, and LNA.

As noted above, the term "wireless" as used herein refers to a device, system and/or method used for radio communications. Thus, an SDR/wireless device or system of the present invention may accommodate voice, internet, video, audio, and/or any other type of data transmitted/received via a radio/wireless channel.

Figure 3A:
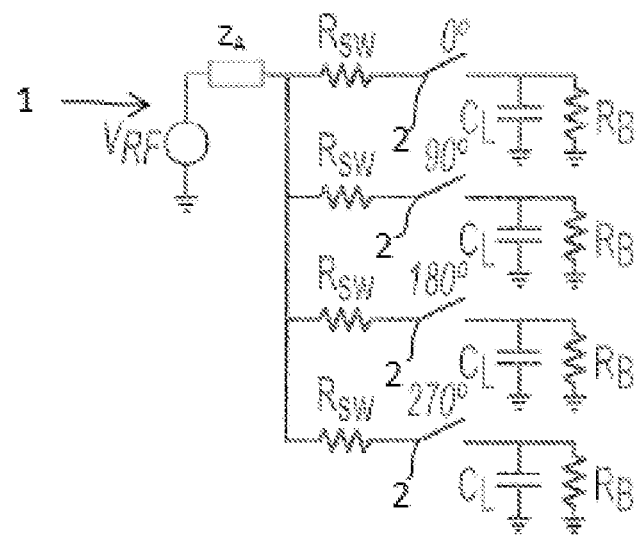
FIGS. 3(a)-3(b) are schematic models of a quadrature passive mixer in accordance with an embodiment of the present invention.
Figure 3B:
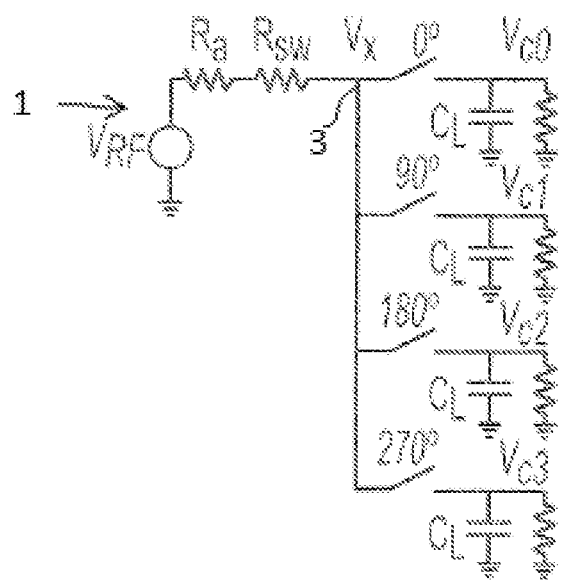
Figure 3C:
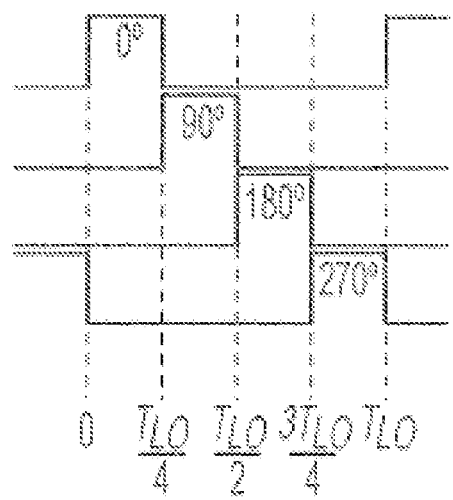
FIG. 3(c) graphically shows four non-overlapping LO pulses that drive the switches illustrated in FIGS. 3(a) and 3(b)

As embodied herein and depicted in FIGS. 3A-B, two equivalent circuit models of a quadrature passive mixer in accordance with the present invention are disclosed. The schematic models of FIGS. 3A-B provide a basis for analyzing a quadrature passive mixer that employs baseband impedance matching. In reference to FIG. 3(a), a quadrature passive mixer 10 is connected directly to an antenna 1 which provides an input voltage waveform $V_{RF}$. The antenna impedance is denoted as $Z_a$. The transistors of the passive mixer 10 are modeled as ideal switches 2. Each switch 2 is shown as being disposed in series with a relatively small resistance Rsw. Those skilled in the art will understand that the resistance $R_{SW}$ is used in conjunction with the switches to mathematically model the transistors. Each switch 2 is also loaded with a capacitor $C_L$ and a resistive load $R_B$. The switches 2 are driven by four non-overlapping LO pulses shown graphically at FIG. 3(c). Each pulse has a 25% duty cycle. Because the pulses do not overlap each other, the antenna port 1 will only see one of the four paths (and therefore one $R_{sw}$) at a time. Thus, the circuit model of FIG. 3(a) may be redrawn as per FIG. 3(b) wherein the four parallel switch resistances $R_{sw}$ are treated as one resistance.

As each switch is closed in sequence, the signal $V_{RF}$ is sampled onto the corresponding $C_L$ during the corresponding LO pulse. The resulting four steady-state voltage levels correspond to differential I and Q down converted baseband signals. The charge on each capacitor slowly leaks through the load $R_B$ to ground. However, as long as the RC time constant (determined by $R_B$ and $C_L$) is much larger than the local oscillator (LO) period, the change in voltage due to the dissipation of charge over a single LO cycle will be small relative to the baseband signals $V_I$ and $V_Q$.

Because passive mixers are bidirectional, the baseband signals present on the capacitors will also be directed back toward the antenna and up-converted during each LO cycle. As a result, a waveform $V_x$ is defined at the virtual node 3 shown in FIG. 3(b). $V_x$ represents the up-converted and superposed baseband voltages. Moreover, $V_x$ may be used to define a current $I_{RF}$, which represents the net current propagating in the conductive path disposed between the antenna port 1 and node $V_x$. Specifically, the current $I_{RF}$ will be proportional to both the current discharged through the baseband resistors and the current coming from the antenna. In fact, the effective impedance seen by the antenna 1 will be a series combination of $R_{sw}$ and a scaled version of $R_B$. The scaling factor for $R_B$ can by calculated by balancing the charge delivered by the input signal to the load $C_L$:

$$\gamma = \frac{2}{\pi^2} \quad (1)$$

This implies that if the mixer switches are designed to have a small resistance $R_{sw}$, the impedance presented to the antenna will largely be a function of $R_B$. Thus, the impedance match may be tuned using $R_B$.

Figure 1A:
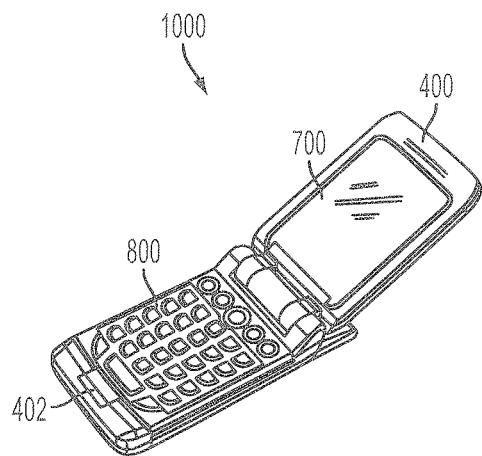
FIGS. 1(a)-(d) are representative SDR form factors in accordance with the present invention.
Figure 1B:
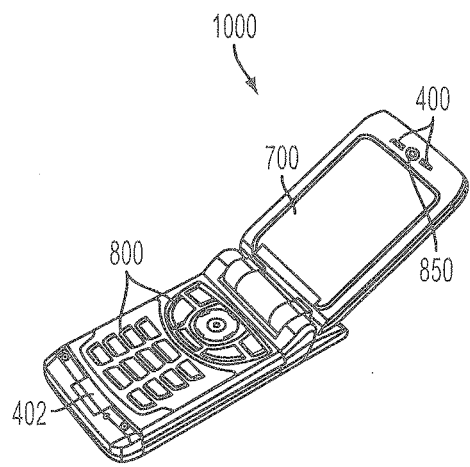
Figure 1C:
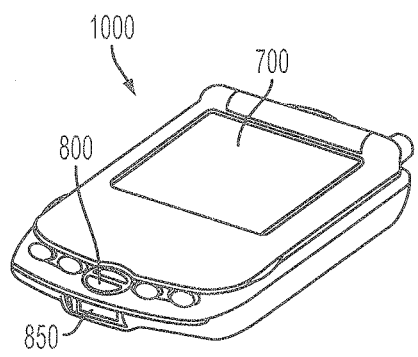
Figure 1D:
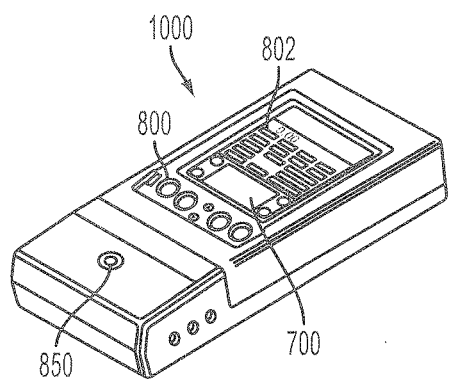
Figure 3D:
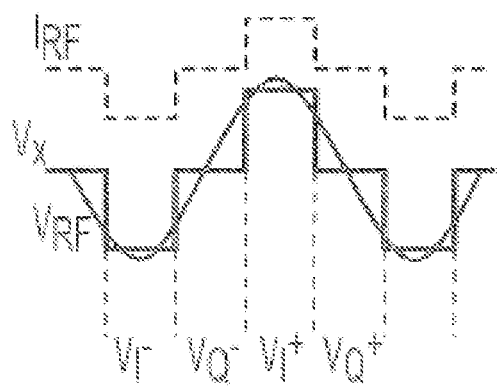
FIG. 3(d) graphically shows a waveform $V_x$, which may be used to define a current $I_{RF}$, which represents the net current propagating in the conductive path disposed between the antenna port 1 and node $V_x$ illustrated in FIG. 3(b), and the original input signal, $V_{RF}$.
Figure 4:
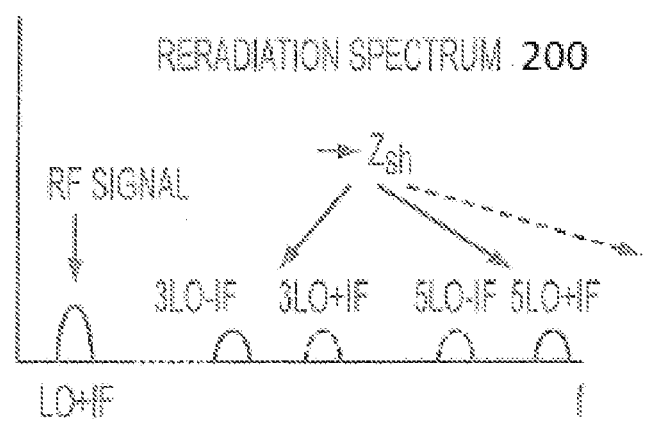
FIG. 4 is a reradiation spectrum corresponding to the schematic models depicted in FIGS. 3(a)-3(b)

In reference to the waveform $V_x$ depicted in FIG. 3(d), its spectrum must contain the original input signal, $V_{RF}$. However, the square shape of $V_x$ indicates that it contains signal power at all of the odd harmonics of the LO in addition to the fundamental. The fact that the mixer samples with quadrature LO signals results in image rejection, and so reduces this content by eliminating one image for each harmonic. See FIG. 4, which depicts the reradiation spectrum 200 corresponding to the circuit models depicted in FIGS. 1(a)-1(b), images 3LO+IF and 5LO−IF are cancelled due to image rejection.

Figure 5:
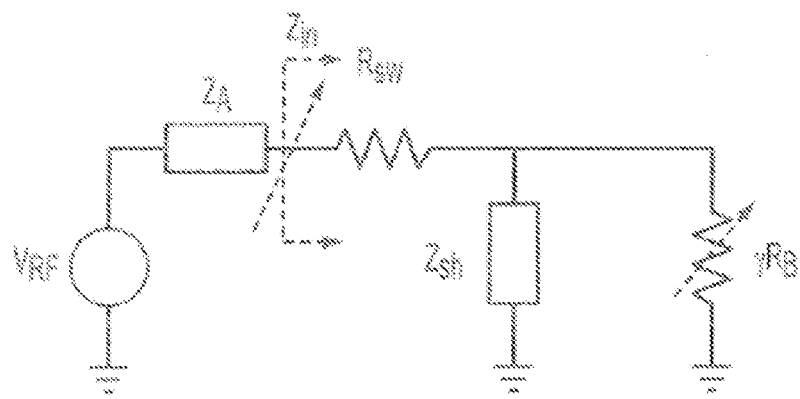
FIG. 5 shows another schematic model of a quadrature passive mixer in accordance with the present invention.

In reference to FIG. 5, another circuit model of a quadrature passive mixer in accordance with the present invention is disclosed. This model incorporates additional losses that were not considered in the models of FIG. 3(a)-3(b). Note that the remaining odd harmonics from FIG. 4 at the antenna port 1 will reradiate out of the antenna such that power is dissipated at these frequencies. Because these harmonics depend on the incoming signal, they represent an additional loss mechanism other than $R_B$ and $R_{sw}$. Since each reradiated harmonic is proportional to, and generated by, the received signal on the baseband, this dissipation will reduce the power of the wanted signal. This loss is modeled as a frequency dependent conductance $Y_{a,n}$ at each odd harmonic, shunting the mixer output.

$$Y_{a,n} = \frac{1}{n^2}(Z_a(n \cdot \omega_{LO}) + R_{sw})^{-1} \quad (2)$$

The total loss due to harmonic reradiation is calculated by summing the effect of each conductance. The overall loss is modeled as an impedance ($Z_{sh}$) in shunt with the mixer output. $Z_{sh}$ is defined as:

$$Z_{sh} = \left[\sum_{n=3,5,7\ldots}^{\infty} |Y_{an}| \cdot \exp(j(\angle Y_{an} + n\pi/2))\right]^{-1} \quad (3)$$

For a system having an antenna impedance that is constant across all frequencies, a value for $Z_{sh}$ may be found as a function of the RF port impedance $Z_a$ and switch resistance $R_{sw}$:

$$Z_{sh} = \frac{4\gamma}{1-4\gamma}(R_{sw} + Z_a) \approx 4.3(R_{sw} + Z_a) \quad (4)$$

In a typical system, where Rsw=20Ω and Za=50Ω, this translates to Zsh=300Ω.

With all the losses taken into account, a linear time-invariant (LTI) model for the passive mixer may be constructed. As noted, the four switch resistances have been combined into one resistance $R_{sw}$ by virtue of the fact that only one switch is on at any given instant. The same may be done for the baseband load $R_B$, noting that it must be multiplied by the scaling factor γ. See equation (1). The virtual impedance $Z_{sh}$ in shunt with $R_B$ must also be added.

The resulting model is shown in FIG. 5 and yields a simple equation for the input impedance of the mixer:

$$Z_{in} = R_{sw} + \gamma R_B \| Z_{sh} \quad (5)$$

Note that this analysis applies to receive signals with a non-zero IF when $R_B$ from (5) is changed to $Z_B(\omega_{IF})$ to account for reactive components in the baseband (such as $C_L$).

Figure 6A:
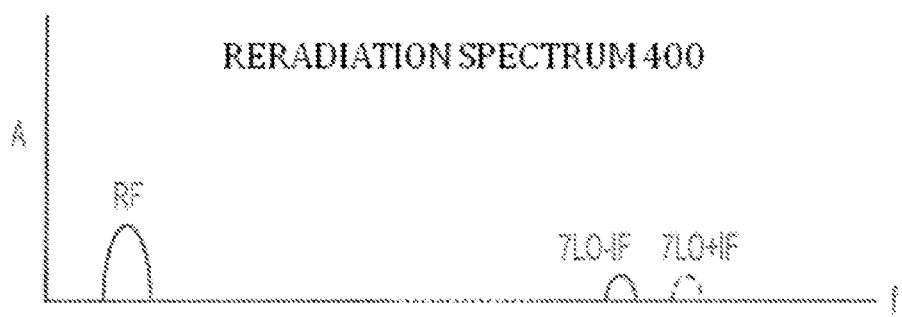
FIGS. 6a-6d are directed to a quadrature passive mixer model that employs eight (8) phase passive mixing and the resulting reradiation spectrum.
Figure 6B:
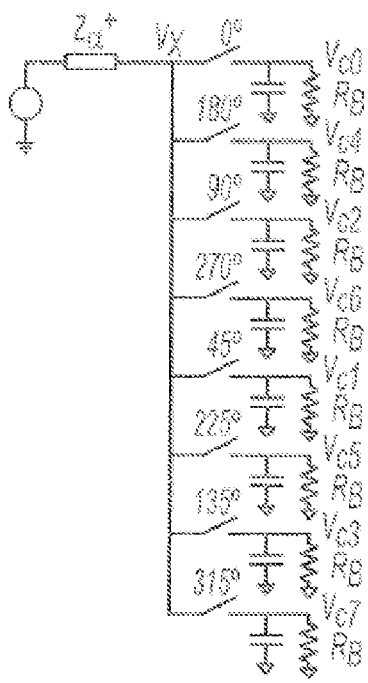
Figure 6C:
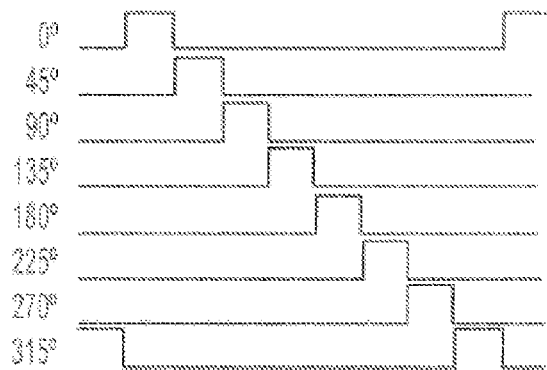
Figure 6D:
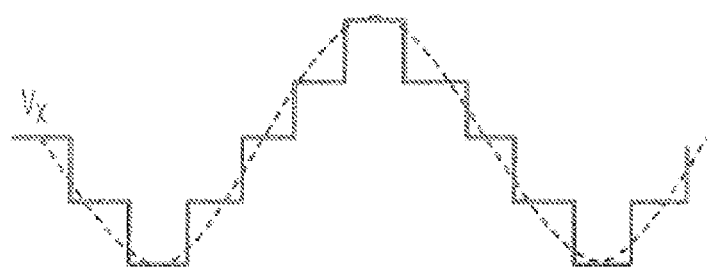

In reference to FIG. 6(a), a reradiation spectrum 400 corresponding to a quadrature passive mixer model that employs eight (8) phase passive mixing is shown. The spectrum of FIG. 6 illustrates the benefits of 8-phase mixing. The expression for $Z_{in}$ from equation (5) has two components which are a function of the duty cycle of the sampling waveform: $\gamma$ and $Z_{sh}$. $Z_{sh}$ will always limit the influence of $R_B$ on the impedance match. $Z_{sh}$ represents shunting due to power near the harmonics of the LO. In order to reduce harmonic reradiation, the mixer shown in FIG. 6(b) is employed. The transistor switches of the passive mixer are driven by eight non-overlapping LO pulses which are shown in FIG. 6(c). Each pulse has a 12.5% duty cycle. As before, because the pulses do not overlap each other, the antenna port 1 will only see one path at a time. Comparing FIG. 6(d) and FIG. 4, the resulting $V_x$ waveform contains power at half as many harmonics when compared to the 4-phase mixer. Specifically, the 8-phase passive mixer eliminates content at the $3^{rd}$, $5^{th}$, $11^{th}$, $13^{th}$ harmonics and so on. As a result, $Z_{sh}$, and the range of $Z_{in}$, increase dramatically. Moreover, the 8-phase mixer yields a new value for the $\gamma$ scaling term:

$$\gamma_{8\,ph} = \frac{2}{\pi^2}(2 - \sqrt{2}). \quad (6)$$

For the case of a constant antenna impedance, this implies:

$$Z_{sh\,8\,ph} = (R_{sw} + Z_a)\frac{8\gamma_{8\,ph}}{1 - 8\gamma_{8\,ph}} = 18.9(R_{sw} + Z_a) \quad (7)$$

In a typical system, where $R_{sw}=20\Omega$ and $Z_a=50\Omega$, this translates to $Z_{Sh}=1323\Omega$, which is about five times larger than in the 4-phase case.

As embodied herein and depicted in FIG. 7, a single-chip receiver 100 in accordance with one embodiment of the present invention is disclosed. A brief overview of the receiver 100 is as follows. Single chip receiver 100 is coupled to an off-chip local oscillator which provides the frequency divider circuit 50 with an LO signal. The frequency divider circuit 50 provides the 8-phase LO driving waveforms for the passive mixer circuitry 10.

The passive mixer circuitry includes four passive mixers (10a, 10b, 10c, and 10d). Each passive mixer 10 includes an RF port 16 that is directly connected to the antenna 1 without any RF matching network therebetween. Each passive mixer 10 also includes parallel transistor switches (12, 14) that are used to sample the incident RF signal in accordance with its corresponding LO driving waveform. Each transistor is connected to a sampling capacitor $C_L$ that is configured to sample the incident RF signal when its corresponding transistor switch is closed. For example, the first mixer 10a includes parallel transistor switches (12, 14) that are closed by the 0° phase LO phase clock and the 180° LO phase clock, respectively. Thus, their respective sampling capacitors $C_L$ provide the baseband low noise amplifier (BB-LNA) 20 with a differential baseband signal. As those of ordinary skill in the art will appreciate, a differential signal includes two identical signals that are perfectly out of phase (i.e., 180°) with each other.

Note that the transistor switch 12 of passive mixer 10b is driven by the 90° LO waveform. As those of ordinary skill in the will appreciate, the 90° LO waveform may be referred to as the quadrature signal of the 0° phase LO phase clock. If the 0° phase LO phase clock is a cosine waveform at a particular frequency, the 90° LO waveform will be a sine waveform at that same frequency. Moreover, note that the 270° LO waveform provided to the parallel transistor switch 14 of passive mixer 10b is perfectly out of phase (i.e., by 180°) with the first transistor 12. The passive mixers 10c and 10d are arranged in the same way. The transistor switches (12, 14) of passive mixer 10c are clocked using the 45° and 225° LO waveforms, respectively. The transistor switches (12, 14) of passive mixer 10d are clocked using the quadrature LO waveforms (i.e., 135°, 315°).

Thus, each BB-LNA (20, 22, 24, and 26) provides an amplified differential signal to gain modules (30, 32). Each gain module 30 provides an in-phase baseband signal component to the in-phase (I) differential amplifier and each gain module 32 provides a quadrature signal component to the quadrature differential amplifier 42. The various signal components are recombined by the I and Q differential amplifiers (40, 42) such that unwanted harmonic signal components are eliminated.

The receiver 100 includes tunable baseband impedance matching and programmable multi-phase mixing features. Note that the sampling capacitors $C_L$ are shown as being adjustable components. The same is true of the feedback resistors $R_{FR}$. The value of the feedback resistors $R_{FR}$ may be adjusted by the software as needed to tune the impedance matching. The purely resistive values of the feedback resistors $R_{FR}$ are translated by the mixer circuitry 10 into complex impedances.

For example, the present invention contemplates a situation wherein a user selects a certain application program (e.g., voice call, Wi-Fi, Bluetooth, GPS, etc.) via the SDR's user interface. The processor of the present invention is configured to interpret the user selection such that the relevant RF parameters (e.g., RF frequency, receive channel bandwidth, etc.) are selected. The processor then provides the desired sampling capacitance ($C_L$) and feedback resistance ($R_{FR}$) by loading a register for each value. The data word may be any suitable length depending on the implementation. In any event, the various bits of the control word are used to control switches such that the number of capacitors comprising sampling capacitor $C_L$ and the number of discrete resistor elements comprising $R_{FR}$ may be added or deleted as necessary. As another example, the present invention also contemplates a situation wherein the user attempts to use the SDR's cell phone facilities at various geographical locations. This may require the SDR to seek cell phone service in the ambient environment by sequentially transmitting service requests at various frequencies. Each time a new RF frequency is selected, the SDR will load the registers of the feedback resistance ($R_{FR}$). Changing the sampling capacitor ($C_L$) will change the bandwidth. In yet another example, once the SDR obtains connectivity with an exterior wireless network, the SDR of the present invention includes system feedback capabilities such that the values of the sampling capacitance ($C_L$) and feedback resistance ($R_{FR}$) are adjusted from time-to-time to obtain and maintain the best possible performance.

Thus, FIG. 7 shows the implemented single-chip receiver architecture, including a programmable 4 or 8 phase frequency divider, quadrature passive mixers, baseband LNAs, and harmonic recombination amplifiers. The inventors have fabricated the receiver in 65 nm 1P9M CMOS. The total area of the chip is approximately 2.5 mm², with an active area of 0.75 mm². The chip may be packaged in any suitable package. For the measurements reported herein, the chip was disposed in a PQFP package and mounted onto a PCB for all measurements. The circuits operate off dual voltage supplies, with the LO buffer, frequency dividers, and mixers using 1.2V and the baseband circuitry using 2.5V. When all the strips are turned on, the 1.2V supply consumes between 6 and 33 mA, depending on the LO frequency, and the 2.5V supply consumes 12 mA. This translates to a power consumption of between 37 and 70 mW.

The passive mixer circuitry 10 may be implemented with triple-well 1.2V NMOS transistors with W=16 μm, L=60 nm. The bulk of the mixer devices (and all 1.2V devices) is tied to the middle of the 2.5V rail. This allows both the inputs and the outputs of the mixer to sit at levels which bias the baseband amplifiers.

When the passive mixer operates in the 4-phase LO case, there is a maximum of eight of these transistors driven by each LO pulse (eight switches in parallel), which reduces the overall switch resistance. In 8-phase operation, a maximum of four unit switches are driven by each individual pulse. As a result, the effective $R_{sw}$ for 8-phase operation is twice that of the 4-phase case. The receiver offers the option of turning off redundant switches, LO generation circuitry, and baseband circuitry in order to operate in a lower power state with as little as only one transistor for each LO pulse.

In order to generate 25% duty cycle quadrature LO pulses, a frequency divide by-two circuit may be employed. The circuit is comprised of two differential latches clocked by opposite phases of the input LO. The standard architecture thus combines the outputs of the divider using AND gates to generate quadrature LO pulses. In simulation, this approach tended to degrade noise figure, due to flicker noise in the dividers. This effect can be explained by coupling of LO onto the RF port, which is then down converted to baseband. Ideally, a 4-phase mixer will only reradiate at multiples of the $4^{th}$ harmonic of the effective LO. However, jitter of individual pulse edges results in reradiation at the receive frequency as well. These deviations are especially hard to suppress through device sizing, because the transistors in the dividers must drive significant internal loads at high speed as part of multi-transistor stacks. It will be apparent to those of ordinary skill in the pertinent art that modifications and variations can be made to the local oscillator and frequency divider circuitry of the present invention depending on baseband impedance, matching considerations, etc. For example, the present invention is depicted herein as being implemented with either 4- or 8-phase mixers. The present invention should not be construed as being limited to these implementations. For example, the present invention may be implemented using any LO frequency. Moreover, the present invention contemplates the inclusion of additional phases such that $V_x$ more closely approximates $V_{RF}$.

Figure 8:
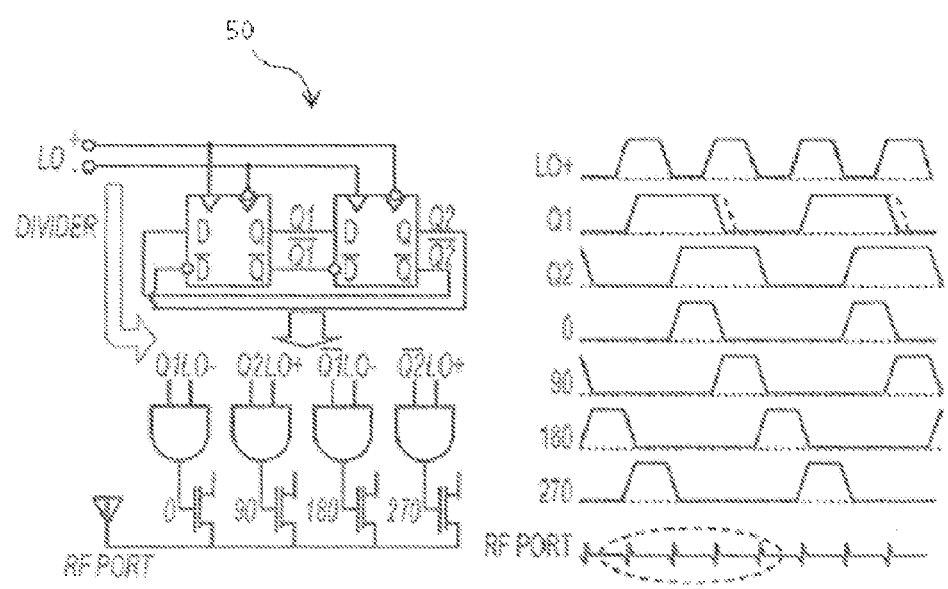
FIG. 8 is a detailed schematic diagram showing an implementation of the multi-phase pulse generation circuit employed in the present invention.

In reference to FIG. 8, a detailed schematic diagram showing an implementation of the multi-phase pulse generation circuit 50 employed in FIG. 7 is disclosed. The pulse generation circuit 50 is a conventional Johnson counter circuit that includes two D-flip flops that are clocked by the differential LO signals (i.e., LO+, LO−). The flip flop outputs (Q1, $\overline{Q1}$, Q2, and $\overline{Q2}$) are combined with the differential LO signals by AND gates in the manner depicted to generate non-overlapping LO phases which are independent of timing variation in the counter itself. This approach was expanded to the 8-phase embodiment by building a four stage differential Johnson counter followed by AND gates to generate eight 25% duty-cycle pulses, split by 45°. The eight pulses are ANDed with the original LO to generate 12.5% pulses; the pulse edges are insensitive to deviations in the counter. As noted above, the present invention is not limited to four or eight phase implementations; any suitable number of phases may be implemented.

Figure 9:
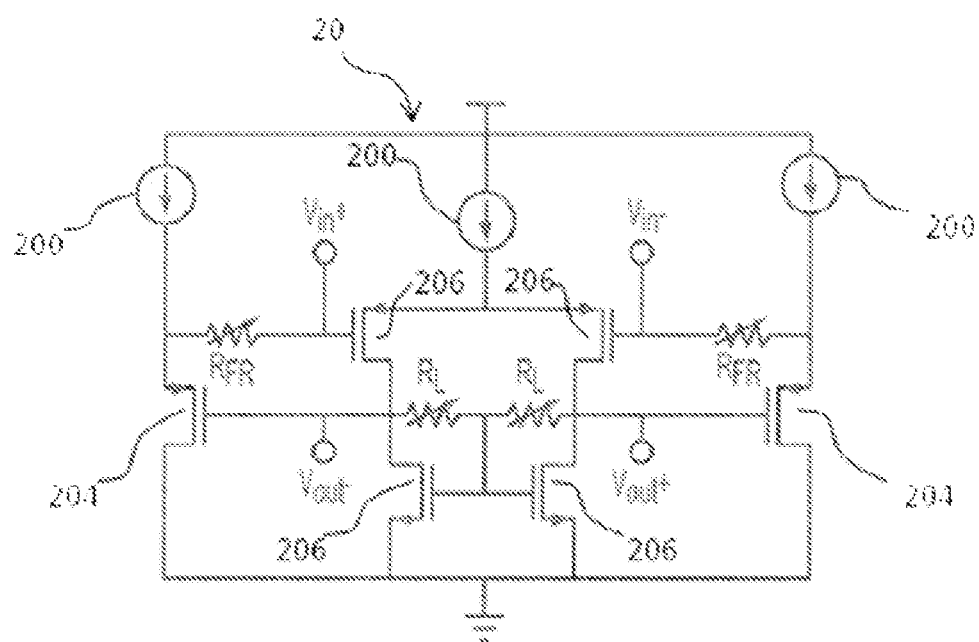
FIG. 9 is a transistor level schematic of the baseband amplifiers depicted in FIG. 7.

As embodied herein and depicted in FIG. 9, a transistor level schematic of the baseband amplifier 20 depicted in FIG. 7 is disclosed. The baseband amplifier 20 includes differential inputs ($V_{IN^+}$, $V_{IN^-}$) and differential output ports ($V_{OUT^+}$, $Y_{OUT^-}$). The power supply (V+) is connected to a current source 200 that is coupled to the input transistor pair 202. The exterior current sources 200 are coupled to source follower amplifiers 204. The baseband LNA 20 also includes differential load transistors 206. The feedback resistors $R_{FR}$ are connected to the source of transistors 204. In one embodiment of the present invention, the amplifier 20 is fabricated using a fully differential PMOS pair with NMOS loads and digitally controlled common mode feedback resistors $R_L$ which provide three gain settings (between 25 and 35 dB). PMOS transistors were selected by the inventors for the input pair. In this embodiment, the amplifier transistors are designed with long channels to reduce the 1/f corner to below 200 kHz.

The matching resistor $R_B$ described in the model of FIG. 3 is implemented by wrapping feedback loops around both paths. The feedback consists of a 5-bit tunable resistor $R_{FR}$ connected to the input gates, in series with a source follower to buffer the output.

As briefly noted above, the receiver has a second stage of amplification in which the eight signals are recombined into simple differential I and Q. The second stage includes tunable-$g_m$ differential pairs (30, 32) which share a common PFET load with common mode feedback and four gain settings (from 16-34 dB in 6 dB steps). When operating in 4-phase mode, the separate but equal I and Q channels (0° and 90°) are simply added together. In 8-phase operation, the 0° phase channel is added with full weight to I, and the 90° phase with full weight to Q. The additional 45° and 135° channels are weighted by $1/\sqrt{2}$ and added to both I and Q, with different polarities. This weighting acts to cancel signals present at half the harmonics of the signal (i.e. the $3^{rd}$, $5^{th}$, $11^{th}$, $13^{th}$, etc). The degree of harmonic suppression achievable in these amplifiers is limited by the precision of the $1/\sqrt{2}$ weight (here it was designed to be $11/16$) and mismatch in the recombination stage. In total, the LNAs and the recombination amplifiers provide more than 70 dB of gain with a maximum BW of 20 MHz, limited by the parasitic capacitance of the amplifiers and some fixed capacitance local to the mixer outputs to shunt switching transients.

Figure 10:
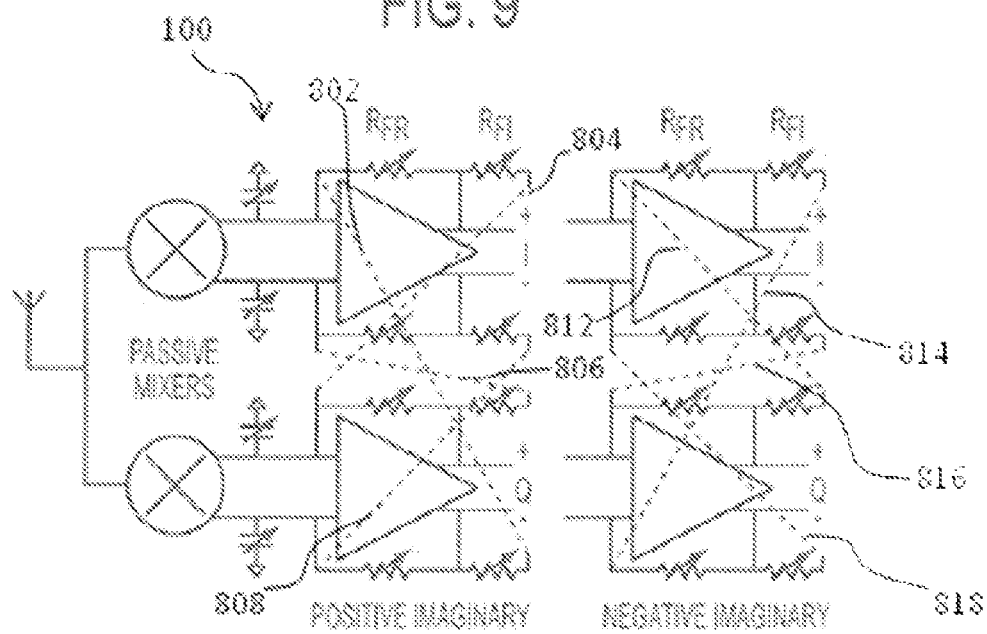
FIG. 10 is a detailed schematic view illustrating the complex feedback employed in the single-chip receiver architecture depicted in FIG. 6.

As embodied herein and depicted in FIG. 10, a detailed schematic view illustrating the complex feedback employed in the single-chip receiver 100 depicted in FIG. 7 is disclosed. While radios are most often designed to match a constant, purely real antenna impedance of 50Ω, in reality, the actual impedance of an antenna can vary widely at different operating frequencies and in different environments. Additionally, the mere presence of parasitics on the printed circuit board (PCB), device package, bond wires and pads inherently make the effective antenna impedance complex.

Figure 19:
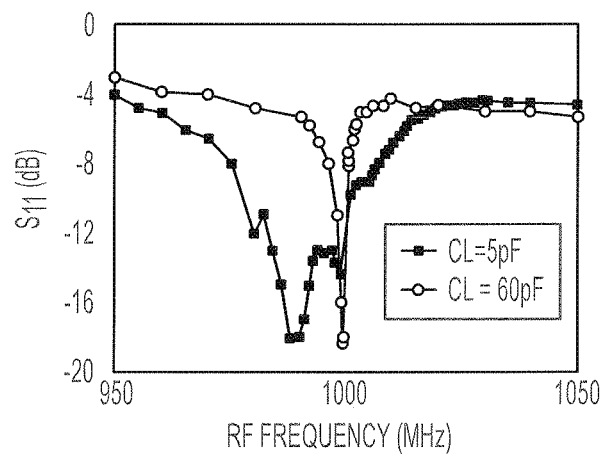
FIG. 19 is a plot of the measured scattering parameter S11 for various values of the sampling capacitor ($C_L$) as a function of the RF frequency.
Figure 20A:
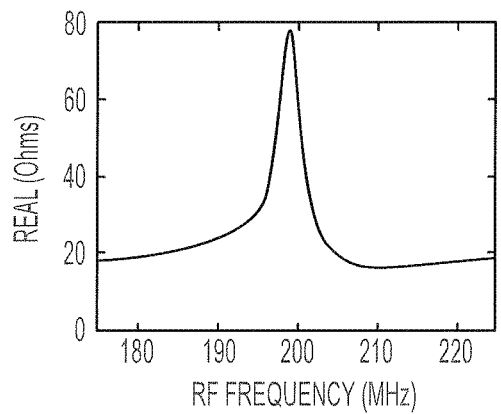
FIG. 20 is a plot of the real and imaginary components of the impedance presented to the RF port as a function of frequency.
Figure 20B:
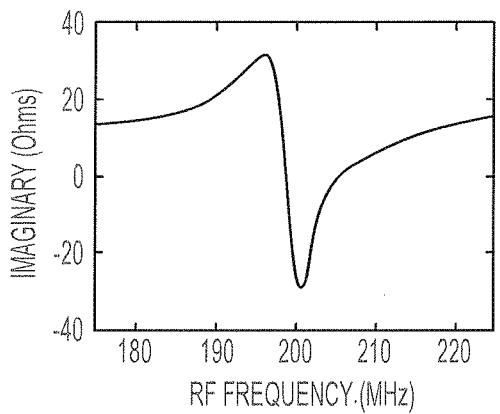

For example, looking ahead to FIG. 19, the center of the S11 notch for the passive mixer-first receiver is not directly centered around the LO but offset by several megahertz. This is because the baseband complex impedance presented by the capacitor $C_L$ interacts with the parasitic complex components of the antenna port. Again looking forward, FIG. 20 shows the impedance presented by the receiver as a function of IF frequency; the imaginary component of $Z_{in}$ looks negative for positive IF and positive for negative IF. On the upper sideband of the LO, the antenna port sees the impedance presented by the baseband port as a function of the IF, but the lower sideband sees the complex conjugate of this impedance. This implies that the required complex conjugate match for a complex antenna impedance can only exist at a single IF frequency.

In principle, the imaginary component of this match is tunable because the value of the capacitor is adjustable. However, using the sampling capacitor $C_L$ to provide a complex impedance match may limit the bandwidth of a good match. Moreover, the sampling capacitor $C_L$ can only be used to match one polarity of imaginary antenna impedance, or in other words it can only match that impedance on one of the side bands of the LO.

Referring to FIG. 10, the complex feedback circuit 800 solves the problem of matching to complex antenna impedances. The complex feedback circuit 800 is used in conjunction with the feedback amplifiers (20-24) shown in FIG. 7 to provide "complex feedback." In the feedback circuit, feedback paths (802, 804, 806 and 808) connect the feedback resistors (i.e., the amplifier output signals scaled by $R_{FI}$) from the output of the I-channel of the amplifier to the input of the Q-channel, and vice-versa such that the scaled amplifier output signals are phase shifted by 90°. The 90° phase shift is translated by the mixers 10 into a complex impedance that is presented to the antenna port. In accordance with present invention the variable resistor $R_{FI}$ may be implemented in the same way as $R_{FR}$ is implemented. Moreover, the outputs of the resistors are switchable between feedback paths (802, 804, 806 and 808) and feedback paths (812, 814, 816 and 818) such that the reactance polarity may be switched (i.e., between +j and −j). Thus, the complex feedback circuit 800 provides a programmable complex impedance match.

Analysis of the complex feedback circuit 800 yields an expression for the new baseband impedance $Z_B$ where the real part is still mostly a function of the real feedback resistor $R_{FR}$, and the imaginary component depends on the value of the resistor $R_{FI}$ $$Z_B = \left[\left(\frac{(1+A)}{R_{FR}} + \frac{1}{R_{FI}}\right) \pm j\frac{A}{R_{FI}}\right]^{-1} \quad (8)$$

Note also that because of the relative phases of sine and cosine, the polarity of the feedback resistors must be flipped from the Q channel to the I channel, in order to get the same equivalent phase shift. Of course this effect only operates within the bandwidth set by the baseband capacitors.

Figure 11:
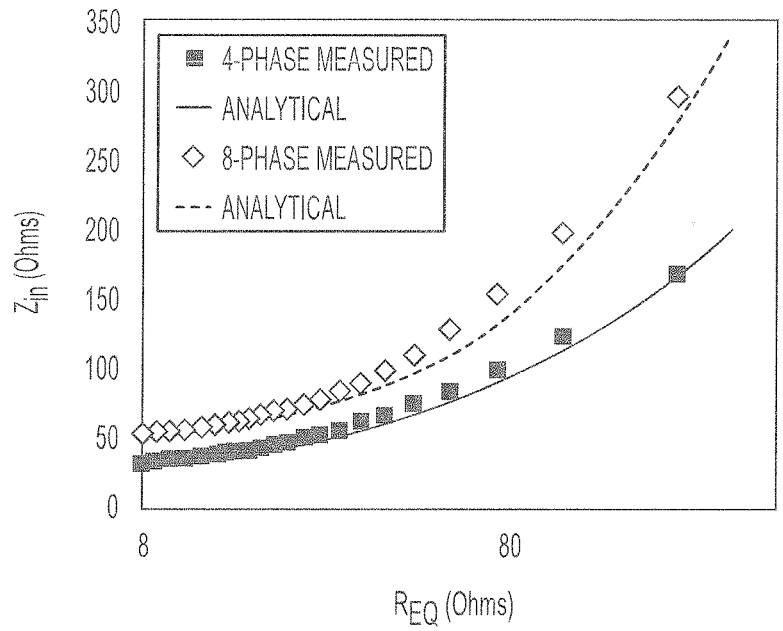
FIG. 11 is a plot of the measured receiver input impedance as a function of the feedback resistor.

In reference to FIG. 11, a plot of the measured receiver input impedance as a function of the feedback resistor is disclosed. To provide a reference for the impedance matching measurements in this section and the following ones, the discussion begins by defining an expected effective impedance presented to the mixer by the baseband which incorporates the gain of the feedback amplifier A, the feedback resistors $R_{FR}$ and $R_{FI}$ and the scaling factor γ:

$$R_{EQ} = \gamma Z_B \quad (9)$$

In order to confirm the analysis provided earlier in the discussion of the circuit models, the input impedance of the receiver has been measured directly for $f_{LO}$=100 MHz, $f_{RF}$=101 MHz. The resulting curves (shown in FIG. 9) show the effect of sweeping the real feedback resistor $R_{FR}$ (scaled to $R_{EQ}$ for both 4-phase and 8-phase operations. FIG. 11 also includes the curves which result from applying equation (5) for simulated A (30 dB) and independently measured $R_{sw}$ and $Z_{sh}$ (i.e., 4-phase: $R_{sw}$=20Ω, $Z_{sh}$=350Ω; 8-phase: $R_{sw}$=40Ω, $Z_{sh}$=1100Ω). As predicted, the effective $R_{sw}$ is about doubled for the 8-phase case. Note also that $Z_{sh}$ is lower than predicted earlier for the 8-phase case. This is because the RF port impedance is frequency dependent. Since higher harmonics account for more of the value of $Z_{sh}$, for the 8-phase case, if the impedance is lower at those higher frequencies, the constant $Z_a$ model will start to fail.

Figure 12:
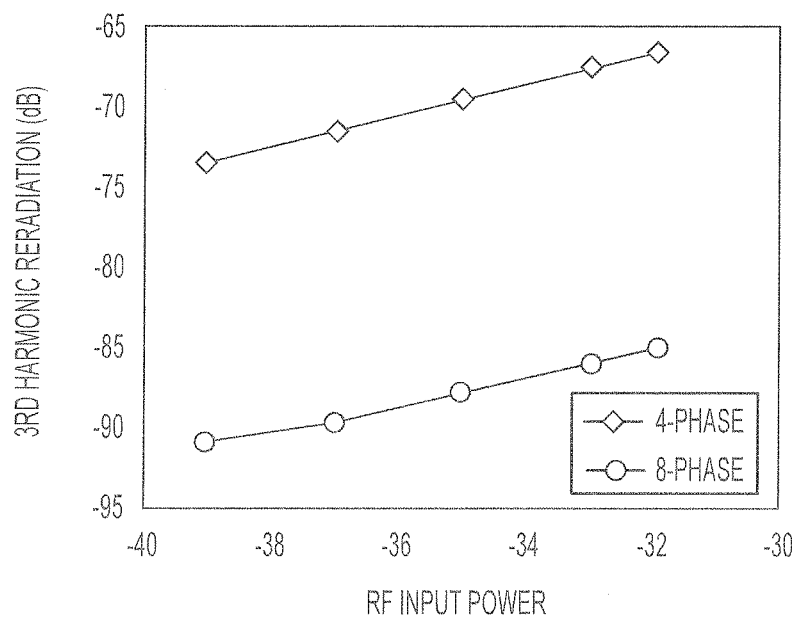
FIG. 12 is a plot of the measured reradiation at the $3^{rd}$ harmonic of the RF frequency out of the RF port for both 4 phase and 8-phase implementations.

In reference to FIG. 12, a plot of the measured harmonic reradiation out of the RF port for both 4 phase and 8-phase implementations is disclosed. In particular, FIG. 12 is directed to the reradiation of injected RF signal up converted to a higher harmonic (as distinct from simple reradiation of LO signals coupling onto the RF port through mixer switch parasitics). Note that this harmonic reradiation is the underlying mechanism behind the virtual lossy element $Z_{sh}$ in the LTI mixer model depicted in FIG. 5. FIG. 12, in particular, shows the measurement for an RF signal injected at 1.001 GHz with a 1 GHz effective LO, which generates a signal at 2.999 GHz, 1 MHz below the 3rd harmonic of the LO. This harmonic reradiation is indeed proportional to the input RF signal strength, and is reduced by about 18 dB with 8-phase mixing. The simple LO reradiation was also measured at 1 GHz to be about −65 dBm.

Figure 13:
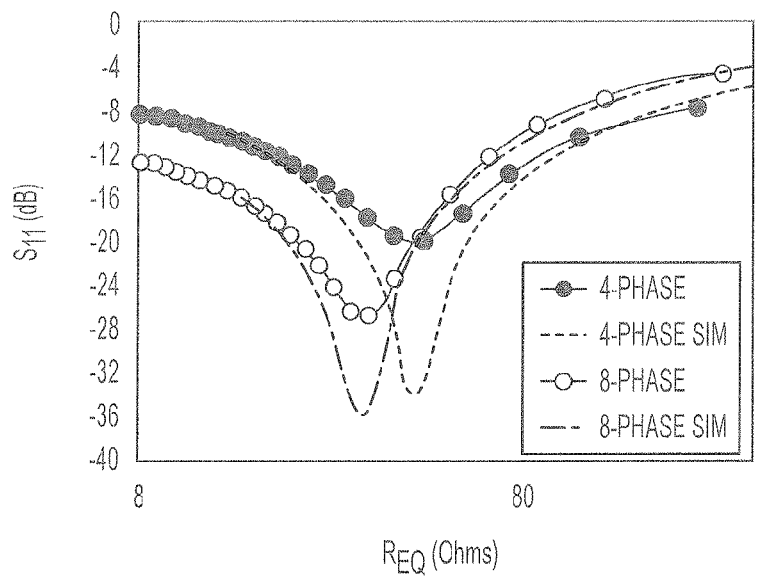
FIG. 13 is a measurement and simulation of the S11 scattering parameter as a function of the tunable feedback resistance.

In reference to FIG. 13, a plot of the measured S11 scattering parameter as a function of the tunable feedback resistance is disclosed. Beyond simply measuring the input impedance, the ability of the receiver to improve an impedance match by tuning $R_{FR}$ is characterized. In particular, FIG. 13 shows a measurement of S11 at $f_{RF}$=1.001 GHz and $f_{LO}$=1 GHz as the feedback resistors are swept for both a 4-phase and 8-phase mixer and driven by a 50Ω source. These curves show that tuning the resistor does in fact allow for a minimum S11. Simulation results for the same sweeps are also superimposed in FIG. 13.

In simulation, the packaging parasitics are modeled with a 2 nH series inductance and 300 fF shunt capacitance. These parasitics create a complex antenna impedance which is frequency dependent and affects $Z_{sh}$. The minimum is for a different effective $R_{EQ}$ in the different mixing cases in FIG. 11, because of their different $R_{sw}$ and $Z_{sh}$ values. However, the match also changes for different IF frequencies, and is asymmetric due to the complex antenna impedance.

Figure 14:
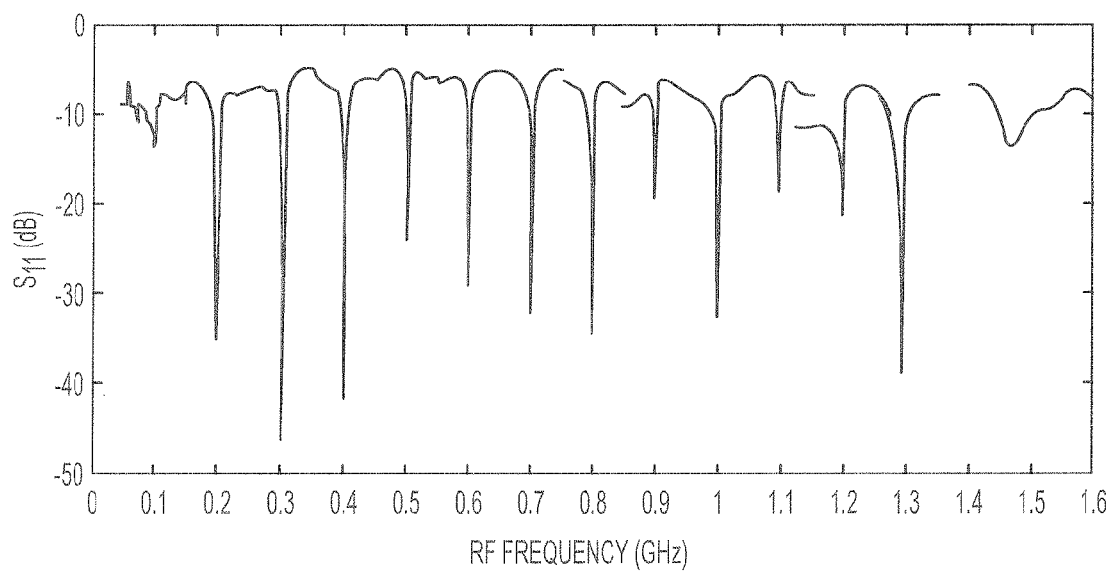
FIG. 14 is a plot of the measured S11 scattering parameters as a function of the local oscillator frequency

FIG. 14 is a plot of the measured S11 scattering parameter as a function of the local oscillator frequency. FIG. 14 shows that the impedance match is not dependent on the LO frequency to the first order but only on the IF. In this measurement, the feedback resistor was tuned to provide a good match for an LO of 800 MHz. The LO was adjusted in 100 MHz steps both upwards and downwards and the S11 was measured at 100 MHz around the LO using a network analyzer (without retuning baseband components). The impedance match begins to break down at higher frequencies because the package parasitics begin to dramatically impact $Z_{sh}$ at these frequencies.

Figure 15:
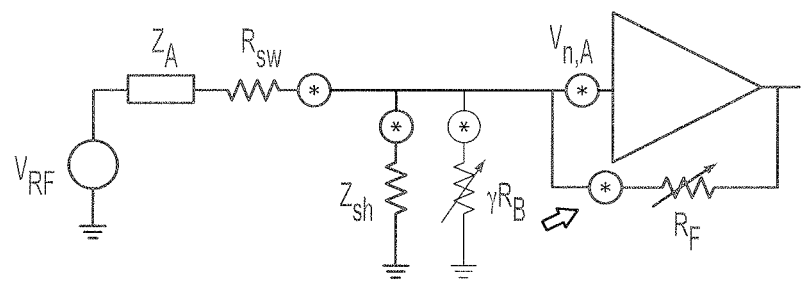
FIG. 15 is a schematic model of the present invention illustrating the various sources of noise.

In reference to FIG. 15, a schematic model of the present invention illustrating the various sources of noise is disclosed. In order to evaluate the noise performance of the receiver, one must first look at the various sources of noise in the circuit shown in FIG. 3b. There are three fundamental sources of noise: the baseband resistance $R_B$, the switch resistance Rsw, and the thermal noise from the antenna itself, Za. Recent work has shown that flicker noise from the switches in passive mixers is negligible. Evaluating the noise figure (inside the baseband bandwidth) from this circuit yields a result which is dominated by $R_B$, and will always be greater than 3 dB.

However, the receiver 100 implements $R_B$ as a feedback resistor wrapped around the baseband low noise amplifier as shown in the model of FIG. 15. This technique suppresses the noise from $R_B$ by a factor proportional to the gain of the amplifier.

There is an additional source of noise in the circuit: the noise which is down-converted by the mixer at odd harmonics of the LO. We can represent this as a noise current which passes through the RF port at each of the harmonics with:

$$\frac{\overline{i_{n,a}^2}(n\omega_{LO})}{Hz} = \frac{4kT}{n^2(Z_a(n\omega_{LO}) + R_{sw})} \quad (10)$$

However, note that the sum of the RF port noise currents at the harmonics of the LO is exactly the noise that would be generated by $Z_{sh}$ if it was a real resistor defined by (4). Thus, the model in FIG. 13 may be used to find the noise factor of receiver 100:

$$F = 1 + \frac{R_{sw}}{R_a} + \frac{R_{sh}}{R_a}\left(\frac{R_a + R_{sw}}{R_{sh}}\right)^2 + \quad (11)$$

$$\gamma\left(\frac{R_{FR}}{R_a}\right)\left(\frac{R_a + R_{sw}}{\gamma R_{FR}}\right)^2 + \gamma\frac{\overline{v_{n,A}^2}}{4kTR_a}\left(\frac{R_a + R_{sw}}{\gamma R_{FR}} + \frac{R_a + R_{sw} + R_{sh}}{R_{sh}}\right)^2$$

The second term represents the noise contributed by $R_{sw}$. The third term represents the noise contributed by the virtual shunt resistor $Z_{sh}$. The fourth term represents the noise contributed by the feedback resistor $R_{FR}$. The fifth term represents the noise contributed by the amplifier. Note that equation (11) applies to both 4- and 8-phase mixing, with the parameters $Z_{sh}$, $\gamma$, and in this implementation, $R_{sw}$ changing. In the ideal case where $R_a$ is constant across frequency, the 8-phase mixer will have a significantly lower NF than the 4-phase mixer.

Figure 16:
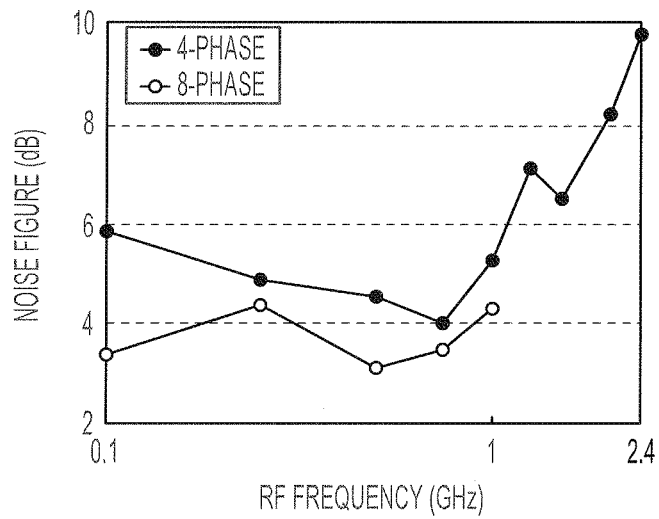
FIG. 16 is a plot of the measured noise figure (NF) as a function of frequency for both the 4-phase and the 8-phase implementations of the present invention.

In reference to FIG. 16, a plot of the measured noise figure (NF) as a function of frequency for both the 4-phase and the 8-phase implementations of the present invention is disclosed. FIG. 14 shows the measured DSB NF for the receiver across the frequency range of operation, with an IF at 1 MHz in each case. The frequency range in the 8-phase mode is lower because it divides the input LO by four instead of two as in the 4-phase case. As predicted by the modeling disclosed herein, the NF for 8-phase operation is lower than for 4-phase operation. NF degradation at higher frequencies is likely due to shunting by package and device parasitics. Such parasitics will also have more effect at higher harmonics, and so will decrease $Z_{sh}$, degrading NF. In addition, at higher frequencies, the LO pulses driving the mixers are likely to become less ideal, potentially increasing the effective Rsw and decreasing Zsh.

Figure 17:
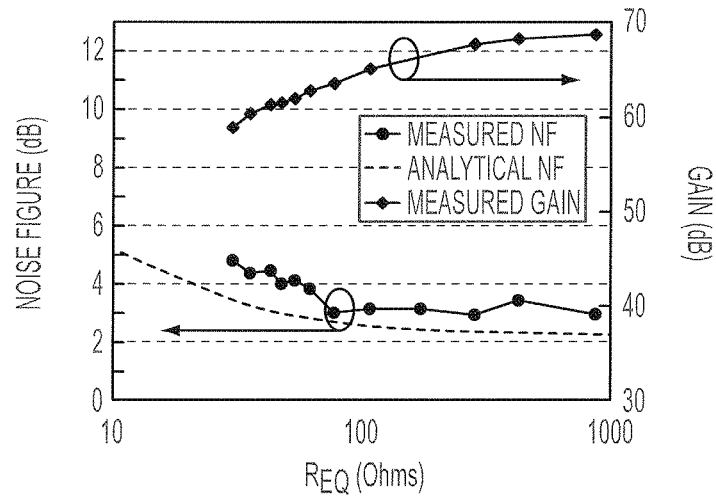
FIG. 17 is a plot of the measured noise figure (NF) as a function of the feedback resistor for the 8-phase implementations of the present invention.

In reference to FIG. 17, a plot of the measured noise figure (NF) as a function of the feedback resistor for the 8-phase implementations of the present invention is disclosed. Following the analytical result in the previous paragraphs, the noise figure of the 8-phase receiver is measured for a range of values of $R_{FR}$. As predicted from equation (11), as long as the ratio of $R_{FR}$ to Ra and the ratio of $Z_{sh}$ to $R_a$ are large, the noise figure will be fairly constant, low, and dominated by the baseband amplifier noise. As $R_{FR}$ decreases, these ratios increase and the $3^{rd}$ and $4^{th}$ terms in equation (11) eventually "blow up," increasing the noise figure. FIG. 17 also shows the gain of the receiver for the same values of $R_{FR}$, where gain decreases as $R_{FR}$ (and thus $R_{EQ}$) decreases. Note that while the NF result reaches levels as low as 3 dB, this is still 1-2 dB higher than that what is predicted in the simulations and by equation (11), the result of which is overlaid with the measurement above. The flicker noise corner of the receiver was also measured and found to be less than 200 kHz under minimum NF conditions.

Figure 18:
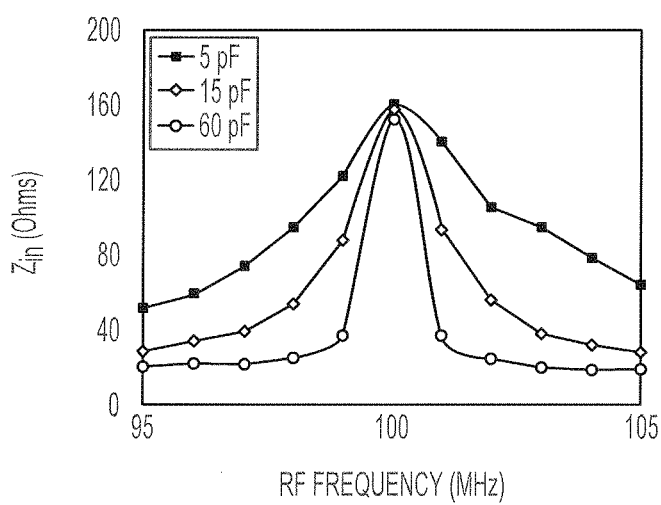
FIG. 18 is a plot of the measured impedance for various values of the sampling capacitor ($C_L$) as a function of the RF frequency.

In reference to FIG. 18, a plot of the measured impedance for values of the sampling capacitor ($C_L$) as a function of the RF frequency is disclosed. The presence of the baseband capacitor $C_L$ has several notable effects on the tunable impedance presented to the RF port. As $f_{IF}$ passes the RC bandwidth of the baseband, Zin becomes dominated by $C_L$, and ultimately approaches $R_{sw}$. By making this capacitor tunable (as shown in the embodiment of FIG. 7), a tunable-Q BPF is created.

In receiver 100, capacitor $C_L$ is digitally controllable with 6 bits of resolution (from 5 pF to 120 pF). FIG. 18 shows measurements of the magnitude of impedance presented by the receiver for three different values of $C_L$ as RF frequency is swept around a 100 MHz LO. For frequencies very near the LO, the receiver presents the expected impedance based on the chosen feedback resistance. As the RF moves away, this impedance is controlled by the capacitor and is reduced as $|f_{LO}-f_{RF}|$ increases (or as $C_L$ increases). Note also that this impedance reaches a lower limit set by the ON resistance of the mixer switches (about 20Ω).

In reference to FIG. 19, a plot of the measured scattering parameter S11 for various values of the sampling capacitor ($C_L$) as a function of the RF frequency is disclosed. In FIG. 19, the effect on the S11 measurement at higher frequencies for a well-tuned $R_{FR}$ value (i.e., matched) is confirmed. As we increase the capacitor value (i.e., from 5 pF to 60 pF), the S11 curve becomes much narrower and the deepest S11 notch is closer to the LO.

FIG. 20 is a plot of the real and imaginary components of the impedance presented to the RF port as a function of frequency. Both the real and complex components of the input impedance were measured for $f_{LO}$=200 MHz and $C_L$=60 pF using a network analyzer. Clearly, the range of a good impedance match here is quite small, as the capacitor dominates the impedance for larger offset frequencies. Additionally, the imaginary component of the impedance demonstrates the interesting property of switching polarities for negative offset frequencies.

In reference to FIGS. 19(*a*)-19(*f*), plots of various measurements illustrating the out-of-band linearity performance of the receiver are disclosed. One implication of having a tunable BPF on the RF port is that it will have a large influence on the out-of-band linearity performance of the receiver. The linearity of the receiver has been characterized for various offset frequencies and capacitor settings.

FIG. 21(*a*) shows out-of-band compression due to a blocker at 1.16 GHz for a 1.2006 GHz RF, for three different CL values. The out-of-band compression level is defined as the power of the blocker which makes the wanted signal diminish by 3 dB.

In FIG. 21(*b*) sweeps of the blocker frequency were performed around the 1.2 GHz RF for the three capacitor settings and the out-of-band compression was measured for each of them. The measured compression levels are well fit by a simple equation (solid lines in FIG. 19(*b*)):

$$P_{OB3db} = -20 \log(k1 + k2/f_{IFint}^2). \quad (12)$$

Where k1 and k2 are fitting parameters and the form of the equation is consistent with a combination of two mechanisms: 1) a constant outband compression point of +10 dBm for far out-of-band blockers which probably reflects compression in the mixer itself, and 2) a frequency dependent term that dominates at lower interferer IF frequencies and follows a 1/f IF int$^2$ dependency. The second component becomes weaker with larger capacitor values, and is consistent with a compressive third-order nonlinearity that acts after one pole of blocker filtering. The second component also reflects nonlinearity in the baseband LNAs.

FIG. 19(c) shows the IIP3 measured using two tones (one at 1.22 GHz and the other at 1.2406 GHz), with a 1.2 GHz LO (generating an IM3 product at 1.1994 GHz, which was downconverted to a 600 kHz IF), for two different settings of $C_L$. An IIP3 of 27 dBm is achieved when a large $C_L$ is chosen, and a much worse IIP3 of −8 dBm when the sampling capacitor $C_L$ is lower.

Figure 21A:
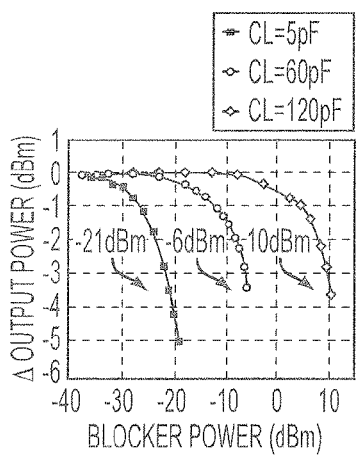
FIGS. 21(a)-21(f) are plots of various measurements illustrating the out-of-band linearity performance of the receiver.
Figure 21C:
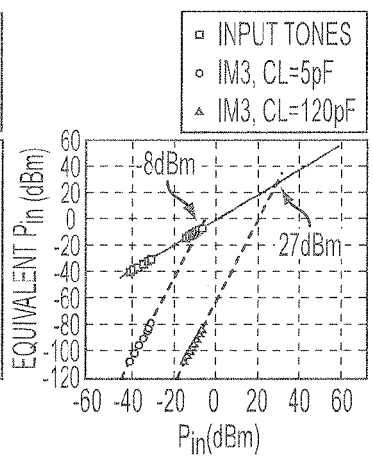
Figure 21E:
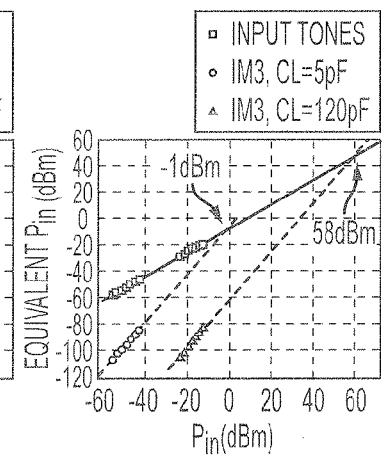
Figure 21B:
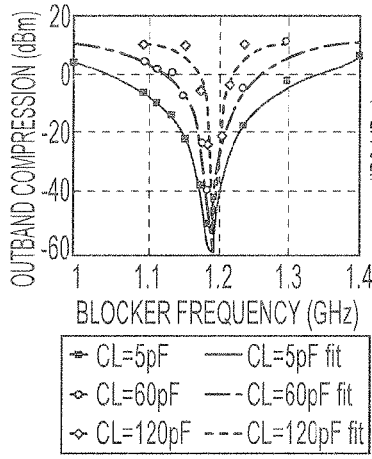
Figure 21D:
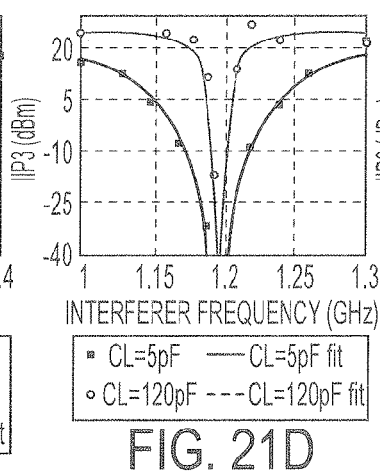

FIG. 21(d) shows the measured IIP3 for various offset frequencies (where the x-axis represents the frequency of the tone which is closer to the RF) for both $C_L$=5 pF and $C_L$=120 pF. This also shows that with a higher $C_L$ engaged, the receiver maintains good linearity for much closer interferers. As before, this result is well fit by equations of a form similar to equation (11) which incorporate a combination of two mechanisms: a constant, very high IIP3 mechanism (presumably from the mixer), and a frequency dependent component that goes as 1/fIFint$^3$ and reflects a third-order nonlinearity in the baseband. These results are consistent with simulations of the baseband amplifiers alone, with the attenuation of the passive mixers and the RC pole accounted for. The out-of-band results are more difficult to replicate in simulation. However, by applying a square-law model to the mixer switches, an out-of-band IIP3 of 24 dBm was computed, which is close to our measurement.

FIG. 19(e) shows the IIP2 for a $2^{nd}$ order inter-modulation product for two tones (one at 1.22 GHz and one at 1.2206 GHz), for a 1.2 GHz LO, generating an IM2 at 1.2006 GHz. An IIP2 of 58 dBm can be achieved when a large $C_L$ is chosen, and a Much worse IIP2 of −1 dBm for minimum capacitor settings, since 20 MHz is close to being within the bandwidth of the receiver 100.

Figure 21F:
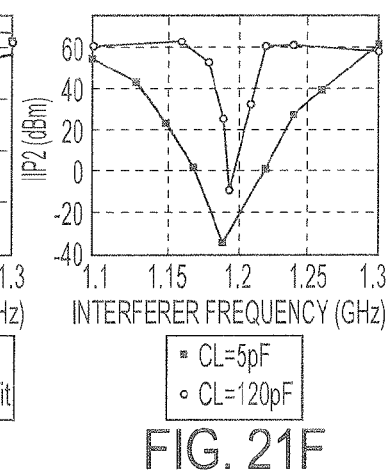

FIG. 21(f) shows the measured IIP2 for various offset frequencies for both $C_L$=5 pF and $C_L$=120 pF. As with other nonlinear effects, as interferers move in-band, they generate larger distortion products. Engaging a larger $C_L$ decreases bandwidth and improves the robustness relative to interferers much closer in frequency. Unlike the $3^{rd}$-order nonlinearity described above, IIP2 does not follow a simple-to-fit rule, indicating that the mechanisms generating IIP2 are likely to be more complex than those generating IIP3.

Because the front-end bandwidth of the receiver 100 is programmable, it is possible to trade off bandwidth for interference tolerance. Thus, the receiver 100 can be programmed to receive signals with bandwidths>10 MHz, but can also be reprogrammed to receive narrower bandwidth signals in the presence of blockers that would badly degrade the system if it were set to its original bandwidth.

Because the present invention is focused on demonstrating low noise, impedance tunability and out-of-band linearity performance, little effort was made to linearize the baseband LNAs and recombination amplifiers for in-band linearity. Nonetheless, the in-band linearity of the receiver has been measured. For a 1 GHz LO, signals were injected at 1.0012 GHz and 1.0016 GHz. These signals produced an IM12 product at 1.0004 GHz and an IM3 product at 1.0008 GHz. This resulted in an in-band IIP2 of −45 dBm and an in-band IIP3 of −67 dBm. In an alternate embodiment of the present invention, in-band linearity is easily improved by designing higher linearity baseband circuits. Indeed, a sensible SDR-style approach would be to make linearity (as a trade off against power consumption) a programmable feature of the baseband.

In addition to characterizing the susceptibility of the receiver to general wideband interferers, the ability of the 8-phase mixer and recombination amplifiers to reduce the effect of blockers at the harmonics of the LO frequency was measured. Because receiver 100 does not include an RF front-end filter, the mixer will downconvert signals present at those harmonics.

In one experiment, the receiver was set-up with an input LO of 2 GHz, for an effective LO of 500 MHz. In order to directly compare the 4-phase case with the 8-phase case, an additional divide-by-two is engaged for the 4-phase case such that both will receive signals around 500 MHz. The difference in gain between signals injected at the fundamental (499 MHz) and those injected at the 3rd and 5th harmonics (1.499 GHz and 2.499 GHz respectively) was measured. In the 4-phase case, the output power for the $3^{rd}$ harmonic was 11 dB less than the fundamental, and the $5^{th}$ harmonic output was 19.9 dB less. This is fairly consistent with the ⅓ and ⅕ weights which accompany these harmonics in the Fourier series of the square wave sampling signals. For the 8-phase case, which actively rejects these harmonics, the output due to the $3^{rd}$ harmonic was 35.4 dB less than the fundamental and that due to the 5th harmonic was 42.6 dB less.

Figure 22:
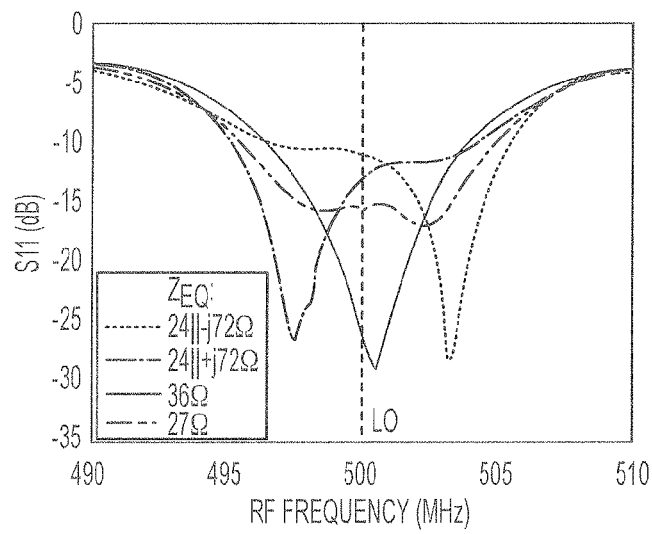
FIG. 22 is a plot of the scattering parameter S11 for both polarities of complex feedback as a function of RF frequency.

The complex feedback scheme employed in the single-chip receiver architecture depicted in FIGS. 5 and 8 was described above. FIG. 22 is a plot of the scattering parameter S11 for both polarities of complex feedback as a function of RF frequency.

In order to measure the effects of complex feedback, receiver 100 was programmed to receive an RF frequency around 500 MHz; the RF frequency was swept using a network analyzer (see 27Ω curve in FIG. 20). The impedance match was tuned with the real feedback resistor to provide a deep S11 notch, without using the complex feedback (see 36Ω curve). Next, the complex feedback path was turned ON with a positive $R_{FI}$ value and the RF frequency was again swept. As expected, the green curve shifted the IF frequency toward the optimum S11. This measurement was repeated with the opposite polarity of complex feedback; this resulted in a notch on the opposite side of the LO frequency.

Figure 23:
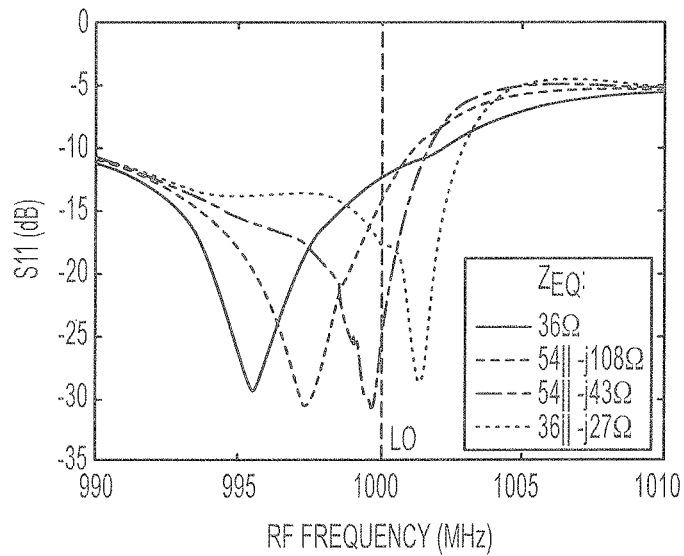
FIG. 23 is a plot of the scattering parameter S11 for various equivalent impedances as a function of RF frequency.

FIG. 23 is a plot of the scattering parameter S11 for various equivalent impedances as a function of RF frequency. To show that complex feedback can be used to provide matching on both sidebands in the face of significant impedance mismatch on the RF port, the effective LO frequency was moved to 1 GHz (e.g., where capacitive parasitics are much more dominant). FIG. 23 shows that without complex feedback, S11 is at a minimum when the IF is significantly offset from the LO. Engaging complex feedback shifts this optimum to very close to the LO frequency. By further decreasing $R_{FI}$ (effectively increasing the influence of complex feedback), the S11 notch can be moved to the other sideband of the LO, dramatically improving S11 for that sideband.

Figure 24:
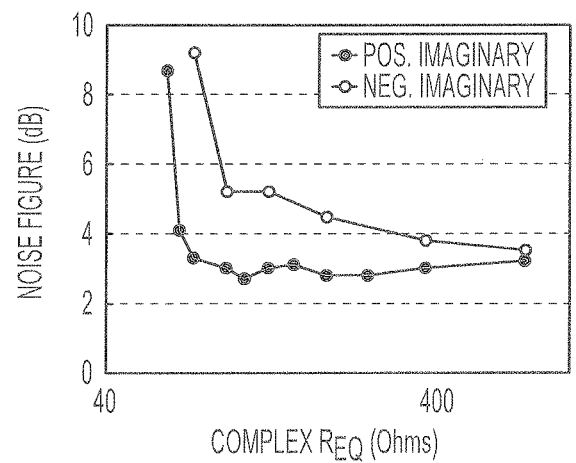
FIG. 24 is a plot of the receiver's measured noise figure as a function of the complex feedback provided by the present invention.

FIG. 24 is a plot of the receiver's measured noise figure as a function of the complex feedback provided by the present invention. FIG. 24 shows the DSB NF of the 8-phase mode receiver for swept $R_{FI}$ of both polarities for an LO at 900 MHz and a 1 MHz IF. Not surprisingly, one polarity provides a better NF than the other because it provides an improved complex conjugate impedance match to the RF port.

As summarized in Table I, the software defined radio receiver 100 of the present invention provides a NF close to 3 dB, out of band IIP3 up to 27 dBm and 0.1-2.4 GHz frequency tuning range.

TABLE I

Summary of Performance

| | |
|---|---|
| Technology | 65 nm |
| Frequency Range | 0.1-2.4 GHz |
| Gain | 40-70 dB |
| DSB NF | 4 dB ± 1 dB |
| Out-of-band IIP3 | +25 dBm |
| Out-of-band IIP2 | +56 dBm |
| Power | 37-70 mW |
| Power Supply | 1.2 V (RF)/2.5 V (Baseband) |
| Impedance Match | $Z_{EQ} = (80 - 250) \| \pm j(8 - 250)\ \Omega$ |

The present invention provides digital control of the entire antenna interface. The transparency of the passive mixers translates the impedance on one side of the mixer to the other side of the mixer such that a LPF on the baseband is translated to a BPF on the RF port. This feature of the present invention is employed to selectively reject out-of-band interferers. Feedback resistors on baseband differential LNAs provide a tunable real impedance match within the bandwidth of the BPF. Moreover, the present invention demonstrates a "complex feedback" feature wherein an effective complex impedance on the RF port is created by using feedback between the in-phase and quadrature paths of the baseband. The complex impedance may be used to match complex RF port impedances. The present invention also shows that the S11 notch tracks the LO frequency of the receiver, and is to first order, only a function of the circuits present on the baseband. Finally, the receiver achieves competitive noise performance with state of the art receivers. In sum, the present invention demonstrates a receiver architecture, which for the first time, provides programmable RF impedance matching and filtering without sacrificing performance.

For example, the passive mixer-first receiver 100 of the present invention achieves: (1) S11 competitive with highly resonant matching networks while tracking the LO frequency; (2) front end filtering which results in out-of-band linearity competitive with implementations using off-chip high-Q filters; and (3) noise performance close to traditional receiver architectures. Moreover, receiver 100 may be tuned across a wide range of LO, IF and RF frequencies with digitally programmed baseband circuits. Further, 8-phase mixing is shown to provide significant benefits such as impedance matching range, rejection of blockers at LO harmonics, and lower NF. Measurements from the receiver implemented in 65 nm CMOS show 70 dB of gain, NF as low as 3 dB, and 25 dBm out-of-band IIP3. Furthermore, tunable impedance matching shows that S11 ∴ 30 dB can be achieved at any receive frequency from 0.1-2.4 GHz.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A wireless communications device comprising:
    an antenna configured to receive an RF signal from an ambient environment, the antenna being characterized by an antenna impedance, the RF signal being characterized by a predetermined frequency;
    a passive mixer assembly coupled to the antenna without an RF matching network, the passive mixer assembly being characterized by a passive mixer impedance presented to the antenna, the passive mixer assembly including a plurality of baseband mixer ports, the passive mixer assembly being configured to downconvert the RF signal and provide a plurality of baseband signals, each baseband signal of the plurality of baseband signals being directed out of a corresponding port of the plurality of baseband mixer ports and characterized by a predetermined phase of a plurality of predetermined phases;
    a baseband low noise amplifier (baseband-LNA) assembly coupled to the passive mixer assembly, the baseband-LNA assembly including an baseband-LNA input portion configured to receive the plurality of baseband signals from the passive mixer assembly, the baseband-LNA assembly being configured to provide a plurality of amplified baseband signals from an baseband-LNA output portion; and
    a baseband feedback network coupled between the baseband-LNA output portion and the baseband-LNA input portion, the baseband feedback network including a plurality of first adjustable resistive components, the plurality of first adjustable resistive components being selectively adjustable such that the passive mixer impedance is substantially matched to the antenna impedance at the predetermined RF frequency.

2. The device of claim 1, wherein the plurality of first adjustable resistive components being selectively adjustable to adjust a gain associated with the baseband-LNA assembly.

3. The device of claim 1, wherein the baseband feedback network further comprises a switchable baseband network coupled between the baseband-LNA output portion and the plurality of baseband mixer ports, the switchable baseband circuit including a plurality of second adjustable resistive components that are selectively adjustable such that the passive mixer impedance substantially corresponds to the complex conjugate of the antenna impedance at the predetermined RF frequency.

4. The device of claim 3, wherein the switchable baseband network is configured to switchably cross-connect a first portion of the plurality of amplified baseband signals into a second portion of the plurality of baseband mixer ports and switchably cross-connect a second portion of the plurality of amplified baseband signals into a first portion of the plurality of baseband mixer ports in accordance with a selected connectivity state.

5. The device of claim 4, wherein the selected connectivity state is switchable between at least a first connectivity state and a second connectivity state, a polarity of the reactance of the passive mixer impedance being selectable by selecting one of the first connectivity state or the second connectivity state such that the polarity of in the first connectivity state being opposite the polarity in the second connectivity state.

6. The device of claim 3, wherein the complex conjugate includes a real portion and a reactive portion, the real portion corresponding to the plurality of first adjustable resistive components, the reactive portion corresponding to the plurality of second adjustable resistive components.

7. The device of claim 6, wherein a polarity of the reactive portion corresponds to a cross-connectivity state of the switchable baseband network.

8. The device of claim 1, wherein the plurality of predetermined phases includes $2^N$ predetermined phases, wherein N is an integer greater than or equal to 2.

9. The device of claim 1, wherein the passive mixer assembly further comprises a plurality of tunable sampling capacitors, the passive mixer impedance is a function of a value associated with each of the plurality of tunable sampling capacitors.

10. The device of claim 9, wherein each of the plurality of tunable sampling capacitors is coupled to a corresponding one of the plurality of first adjustable resistive components at each of the plurality of baseband mixer ports, each tunable sampling capacitor and its corresponding first adjustable resistive component forming a tunable bandpass filter having a tunable predetermined quality factor (Q).

11. The device of claim 1, wherein the passive mixer assembly further comprises:
a frequency divider assembly configured to divide a local oscillator (LO) signal into a plurality of local oscillator (LO) pulses, each LO pulse being characterized by the predetermined phase of the plurality of predetermined phases; and
a plurality of switches coupled to the frequency divider assembly, each switch of the plurality of switches being configured to multiply the RF signal by one of the plurality of local oscillator (LO) pulses to thereby generate one of the plurality of baseband signals.

12. The device of claim 11, wherein the plurality of baseband signals includes a plurality of in-phase baseband signals and a plurality of quadrature-phase baseband signals, and wherein the plurality of amplified baseband signals includes a plurality of in-phase amplified baseband signals and a plurality of quadrature-phase amplified baseband signals.

13. The device of claim 12, wherein the plurality of baseband signals includes a plurality of differential baseband signals, and wherein the plurality of amplified baseband signals includes a plurality of differential amplified baseband signals.

14. The device of claim 11, wherein the plurality of switches include a plurality of switch pairs, each switch pair of the plurality of switch pairs including a first switch configured to multiply the RF signal by a first LO pulse and a second switch configured to multiply the RF signal by a second LO pulse 180° out of phase with respect to the first LO pulse.

15. The device of claim 14, wherein the baseband-LNA assembly includes a baseband-LNA coupled to each of the plurality of switch pairs such that the baseband-LNA provides a differential amplified baseband signal, and wherein the baseband feedback network includes a pair of first adjustable resistive components coupled to each baseband-LNA.

16. The device of claim 1, further comprising a harmonic recombination amplifier assembly coupled to the baseband-LNA assembly, the harmonic recombination amplifier being configured to recombine the plurality of amplified baseband signals to thereby generate a composite baseband signal.

17. The device of claim 1, wherein the harmonic recombination amplifier includes an in-phase differential amplifier and a quadrature-phase differential amplifier, the in-phase differential amplifier being configured to recombine a first portion of the plurality of amplified baseband signals to thereby generate a composite in-phase baseband signal, and wherein the quadrature differential amplifier is configured to recombine a second portion of the plurality of amplified baseband signals to thereby generate a composite quadrature-phase baseband signal, the in-phase differential amplifier and the quadrature-phase differential amplifier are configured to substantially eliminate unwanted harmonic signal components.

18. A wireless communications device comprising:
an antenna configured to receive an RF signal from an ambient environment, the antenna being characterized by an antenna impedance, the RF signal being characterized by a predetermined frequency;
a passive mixer assembly coupled to the antenna without an RF matching network, the passive mixer assembly being characterized by a passive mixer impedance presented to the antenna, the passive mixer assembly including a plurality of baseband mixer ports, the passive mixer assembly being configured to downconvert the RF signal and provide a plurality of baseband signals, each baseband signal of the plurality of baseband signals being directed out of a corresponding port of the plurality of baseband mixer ports and characterized by a predetermined phase of a plurality of predetermined phases; and
a baseband low noise amplifier (baseband-LNA) assembly coupled to the passive mixer assembly, the baseband-LNA assembly including an baseband-LNA input portion configured to receive the plurality of baseband signals from the passive mixer assembly, the baseband-LNA assembly being configured to provide a plurality of amplified baseband signals from an baseband-LNA output portion; and
a baseband feedback network coupled between the baseband-LNA output portion and the baseband-LNA input portion, the baseband feedback network including a plurality of first adjustable resistive components and a plurality of second adjustable resistive components that are switchable between a first feedback connective state and a second feedback connective state, the plurality of first adjustable resistive components and the plurality of second adjustable resistive components being individually adjustable such that the passive mixer impedance substantially corresponds to the complex conjugate of the antenna impedance at the predetermined RF frequency.

19. The device of claim 18, wherein the complex conjugate includes a real portion and a reactive portion, the real portion corresponding to the plurality of first adjustable resistive components, the reactive portion corresponding to the plurality of second adjustable resistive components, and wherein the first feedback connective state corresponds to a first polarity of the reactive portion and the second feedback connective state corresponds to a second polarity of the reactive portion, the first polarity being opposite to the second polarity.

20. A software defined radio (SDR) device comprising:
   a user interface disposed on or in a SDR housing, the user interface including at least one data input portion and at least one data output portion, the at least one data input portion being configured to generate a plurality of computer readable commands;
   a computing circuit assembly coupled to the user interface, the computing circuit assembly being configured to process the plurality of computer readable commands and drive the at least one data output portion, the computing circuit assembly being programmed to
      select an SDR mode of operation in response to the plurality of computer readable commands or an SDR operational environment,
      determine a plurality of RE parameters based on the SDR mode of operation, the plurality of RE parameters including a predetermined frequency,
      determine a plurality of variable baseband parameters corresponding to the plurality of system RE parameters, and
      provide the plurality of variable baseband parameters to a memory portion; and
   a wireless communications assembly, the assembly comprising,
      an antenna configured to receive an RF signal from an ambient environment, the antenna being characterized by an antenna impedance, the RF signal being characterized by the predetermined frequency,
      a passive mixer assembly coupled to the antenna without an RF matching network, the passive mixer assembly being characterized by a passive mixer impedance presented to the antenna, the passive mixer assembly including a plurality of baseband mixer ports, the passive mixer assembly being configured to downconvert the RF signal and provide a plurality of baseband signals, each baseband signal of the plurality of baseband signals being directed out of a corresponding port of the plurality of baseband mixer ports and characterized by a predetermined phase of a plurality of predetermined phases,
      a baseband low noise amplifier (baseband-LNA) assembly coupled to the passive mixer assembly, the baseband-LNA assembly including an baseband-LNA input portion configured to receive the plurality of baseband signals from the passive mixer assembly, the baseband-LNA assembly being configured to provide a plurality of amplified baseband signals from an baseband-LNA output portion,
      a baseband feedback network coupled between the baseband-LNA output portion and the baseband-LNA input portion, the baseband feedback network including a plurality of first adjustable resistive components and a plurality of second adjustable resistive components that are switchable between a first feedback connective state and a second feedback connective state, the plurality of first adjustable resistive components and the plurality of second adjustable resistive components being individually adjustable such that the passive mixer impedance substantially corresponds to the complex conjugate of the antenna impedance at the predetermined RF frequency.

\* \* \* \* \*